US012731649B2

(12) United States Patent
Wang

(10) Patent No.: US 12,731,649 B2
(45) Date of Patent: Sep. 8, 2026

(54) COLUMN CONTROL CIRCUITS AND STORAGE DEVICES

(71) Applicant: CXMT CORPORATION, Hefei (CN)

(72) Inventor: Zijian Wang, Hefei (CN)

(73) Assignee: CXMT CORPORATION, Hefei (CN)

( * ) Notice: Subject to any disclaimer, the term of this patent is extended or adjusted under 35 U.S.C. 154(b) by 103 days.

(21) Appl. No.: 18/948,283

(22) Filed: Nov. 14, 2024

(65) Prior Publication Data

US 2025/0069672 A1 Feb. 27, 2025

Related U.S. Application Data

(63) Continuation of application No. PCT/CN2024/078016, filed on Feb. 22, 2024.

(30) Foreign Application Priority Data

Mar. 28, 2023 (CN) ........................ 202310311820.1

(51) Int. Cl.
*G11C 16/04* (2006.01)
*G11C 16/26* (2006.01)
*G11C 16/32* (2006.01)

(52) U.S. Cl.
CPC .......... *G11C 16/32* (2013.01); *G11C 16/0483* (2013.01); *G11C 16/26* (2013.01); *Y02D 10/00* (2018.01)

(58) Field of Classification Search
CPC ..... G11C 16/0483; G11C 16/26; G11C 16/32; Y02D 10/00
USPC ....................................................... 365/233.1
See application file for complete search history.

(56) References Cited

U.S. PATENT DOCUMENTS

| | | | | |
|---|---|---|---|---|
| 2009/0086077 A1* | 4/2009 | Wada | H04N 25/00 | 348/308 |
| 2011/0199844 A1* | 8/2011 | Miki | G11C 11/40615 | 365/207 |
| 2020/0027522 A1* | 1/2020 | Nakaoka | G11C 29/44 | |

FOREIGN PATENT DOCUMENTS

| | | |
|---|---|---|
| CN | 108520764 A | 9/2018 |
| CN | 110648703 A | 1/2020 |
| CN | 116030853 A | 4/2023 |
| CN | 116052737 A | 5/2023 |
| KR | 20070067399 A | 6/2007 |

(Continued)

OTHER PUBLICATIONS

ISR Received in PCT/CN2024/078016; mailed May 18, 2024.

*Primary Examiner* — Ly D Pham
(74) *Attorney, Agent, or Firm* — Syncoda LLC; Feng Ma

(57) ABSTRACT

Provided are a column control circuit and a memory device. The column control circuit includes a delay control circuit and a control signal generation circuit. The delay control circuit receives a column selection start signal, and generates and outputs a column selection end signal. The column selection end signal has a first delay amount relative to the column selection start signal. The control signal generation circuit receives the column selection start signal, the column selection end signal, and a target bank group selection signal, and generates and outputs a target column selection start signal, a target column selection window signal, and a target column selection end signal. The target column selection window signal has a second delay amount relative to the column selection start signal, the second delay amount is less than or equal to the first delay amount.

19 Claims, 14 Drawing Sheets

(56) References Cited

FOREIGN PATENT DOCUMENTS

KR 20080053590 A 6/2008

* cited by examiner

101
CSLEN0T
Delay control circuit
RD_MID
CSLDIS

COLUMN CONTROL CIRCUITS AND STORAGE DEVICES

CROSS-REFERENCES TO RELATED APPLICATIONS

The present disclosure is a continuation of PCT/CN2024/078016, filed on Feb. 22, 2024, which claims priority to Chinese Patent Application No. 202310311820.1, filed with the China National Intellectual Property Administration on Mar. 28, 2023 and entitled "COLUMN CONTROL CIRCUIT AND MEMORY DEVICE", which is incorporated herein by reference in its entirety.

FIELD

The present disclosure relates to but is not limited to a column control circuit and a memory device.

BACKGROUND

Semiconductor memories are utilized in many electronic systems to store data that can be retrieved later. The semiconductor memory is usually controlled by providing a command, an address, and a clock for the semiconductor memory. Various memory operations may be performed by the semiconductor memory in response to the command. For example, a read command enables the semiconductor memory to perform a read operation to retrieve data from the semiconductor memory, and a write command enables the semiconductor memory to perform a write operation to store data in the semiconductor memory. A location of a semiconductor memory for an access operation is identified by the address, and a time sequence of various operations and provision of data is provided by the clock. To improve an internal data throughput and facilitate simultaneous reading of more data, the semiconductor memory may be divided into multiple bank groups (BG). Data can be independently written into or read from each bank group.

SUMMARY

Embodiments of the present disclosure provide a column control circuit and a memory device. At least one column control circuit that can be applied to multiple bank groups is provided, to ensure that a column selection end signal can always be sampled by a target column selection window signal to obtain a target column selection end signal.

According to a first aspect, an embodiment of the present disclosure provides a column control circuit, including: a delay control circuit, configured to receive a column selection start signal and perform delay processing on the column selection start signal to generate and output a column selection end signal, the column selection end signal having a first delay amount relative to the column selection start signal; and a control signal generation circuit, connected to the delay control circuit and configured to: receive the column selection start signal, the column selection end signal, and a target bank group selection signal, and perform a first logical operation on the column selection start signal and the target bank group selection signal to generate and output a target column selection start signal; and generate and output a target column selection window signal based on the column selection start signal and the target bank group selection signal, and perform a second logical operation on the target column selection window signal and the column selection end signal to generate and output a target column selection end signal, the target column selection window signal having a second delay amount relative to the column selection start signal, the second delay amount being less than or equal to the first delay amount, and active duration of the target column selection window signal being greater than or equal to active duration of the target bank group selection signal.

According to a second aspect, an embodiment of the present disclosure further provides a memory device, including: multiple bank groups, each of the bank groups including multiple memory cell arrays, each of the memory cell arrays including multiple memory cells, and each of the memory cell arrays being connected to multiple column selection switching transistors; and the column control circuit according to any one of the foregoing embodiments. The column selection switching transistor is turned on in response to a corresponding target column selection start signal, and is turned off in response to the target column selection end signal.

BRIEF DESCRIPTION OF THE DRAWINGS

One or more embodiments are exemplified with the figures in the accompanying drawings corresponding to the one or more embodiments. These example descriptions are not intended to limit the embodiments. Elements with the same reference numerals in the accompanying drawings are similar elements, and unless specifically stated, no scale limitations are constituted by the figures in the accompanying drawings. To describe the technical solutions in the embodiments of the present disclosure or the conventional technologies more clearly, the accompanying drawings required by the embodiments are briefly described below. Clearly, the accompanying drawings in the following description show merely some embodiments of the present disclosure, and other drawings may be obtained by a person of ordinary skill in the art from these accompanying drawings without creative efforts.

DETAILED DESCRIPTION OF THE DISCLOSURE

Figures 1, 2:
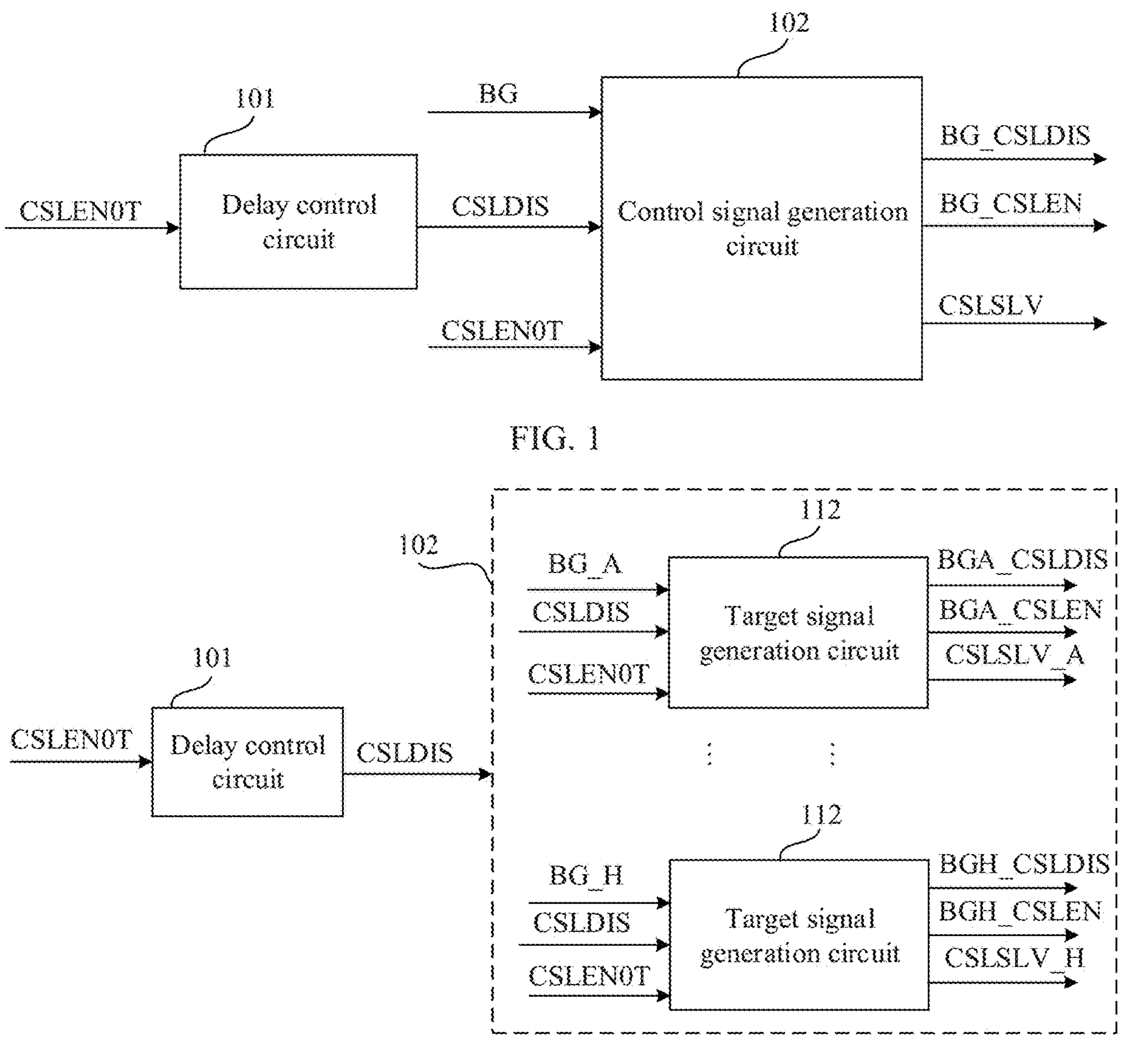
FIG. 1 is a functional block diagram of a column control circuit according to an embodiment of the present disclosure.
FIG. 2 is another functional block diagram of a column control circuit according to an embodiment of the present disclosure.

Embodiments of the present disclosure provide a column control circuit, which may be applied to a memory device. The column control circuit provided in the embodiments of the present disclosure is described in detail below with reference to the accompanying drawings.

The memory device may include multiple bank groups. When the same bank group is continually accessed, there is a first delay time tCCD_L between access commands for the same bank group, in other words, the same bank group may be accessed again after the first delay time tCCD_L following access to the same bank group. The first delay time tCCD_L may represent a minimum time interval required for accessing the same bank group.

When different bank groups are continually accessed, any bank group may be accessed again after a second delay time tCCD_S following access to another bank group, in other words, there is the second delay time tCCD_S between access commands for different bank groups. The second delay time tCCD_S may represent a minimum time interval required for accessing different bank groups. The first delay time tCCD_L is usually greater than the second delay time tCCD_S.

Taking a read operation as an example, a column selection start signal is generated based on a read command, and then a column selection window signal is generated after the read command is cyclically flipped based on the quantity of cycles corresponding to the first delay time. The memory device operates at different operating frequencies, and at each operating frequency, it is expected that a delay between the column selection start signal and the column selection window signal does not change with the frequency and remains relatively stable. Because the first delay time changes with the operating frequency, it may be considered that the first delay time can represent the frequency, and therefore, the following formula exists:

$$tCK \times Shift\_Cycle = CSLM\text{-}S \quad (1), \text{ where}$$

tCK is a time of one clock cycle corresponding to the operating frequency, Shift_Cycle is the quantity of shift cycles, CSLM-S is the delay between the column selection start signal and the column selection window signal, and the delay between the column selection start signal and the column selection window signal is a pulse width of CSLM-S. The pulse width of CSLM-S is also active duration of a column strobe signal. In other words, the pulse width of CSLM-S is duration in which the column strobe signal is enabled. If the column strobe signal is connected to a column selection switching transistor, and the column strobe signal is enabled, the corresponding column selection switching transistor is turned on.

In an example, to ensure turn-on duration of a column selection switching transistor connected to a bit line, and ensure a sufficient time for completely transmitting data on the bit line to a local data line (namely, LIO), a time of CSLM-S should be greater than or equal to 2.5 ns. As the operating frequency increases, for a margin point at which a minimum pulse width is the second delay time tCCD_S=8tCK, even if the pulse width of CSLM-S is greater than 8tCK, an active time that CSLM-S needs to meet is no longer met, in other words, the pulse width of CSLM-S is less than 2.5 ns. As a result, the column selection window signal cannot cover corresponding bank group address information, and it cannot be ensured that active duration of a column strobe signal of a bank group corresponding to the corresponding bank group address information meets a requirement.

In addition, it may be understood that in a specific example, the pulse width of CSLM-S being 2.5 ns is intended to maintain a time in which the column strobe signal is enabled. In addition, to ensure a sufficient precharging time of the local data line or ensure that the column strobe signal does not affect a precharging process, the column strobe signal needs to be disabled before precharging starts. A time from the start of the column strobe signal to the end of precharging is fixed (e.g., at 5 ns). In an example in which the precharging time of the local data line is 1.25 ns, to ensure the precharging time of the local data line, CSLM-S may be set to be greater than 3 ns and less than 3.75 ns. If the manner in which the pulse width of CSLM-S is 8tCK is still expected for implementation, tCK needs to be greater than or equal to 0.375 ns. However, for a high-frequency memory device whose operating frequency is 6000 MHz or higher, 1tCK is far less than 0.375 ns, in other words, a requirement cannot be met in the manner in which the pulse width of CSLM-S is 8tCK.

In the technical solution of the column control circuit provided in this embodiment of the present disclosure, a logical operation is performed on a bank group selection signal and a column selection start signal to generate a target column selection window signal of a corresponding bank group, so that regardless of whether two consecutive column selection start signals access the same bank group or different bank groups, a target column selection window signal generated based on the first column selection start signal has a second delay amount relative to the column selection start signal, and active duration of the target column selection window signal is greater than or equal to active duration of the target bank group selection signal. Because the delay (the second delay amount) of the target column selection window signal relative to the column selection start signal is less than a delay (a first delay amount) of a column selection end signal relative to the column selection start signal, the active duration of the target column selection window signal can cover active duration of the column selection end signal, to ensure that a target column selection end signal corresponding to a corresponding target bank group can be generated at all operating frequencies.

In addition, the delay of the target column selection end signal relative to the column selection start signal depends on the first delay amount. The first delay amount can be properly set to ensure that the active duration of the column strobe signal can be greater than 3 ns at different operating frequencies, in other words, the active duration of the column strobe signal is no longer affected by the foregoing margin point having 8tCK.

FIG. 1 is a functional block diagram of a column control circuit according to an embodiment of the present disclosure.

Referring to FIG. 1, the column control circuit provided in this embodiment of the present disclosure includes a delay control circuit 101 and a control signal generation circuit 102 connected to the delay control circuit 101.

The delay control circuit 101 is configured to receive a column selection start signal CSLEN0T and perform delay processing on the column selection start signal CSLEN0T to generate and output a column selection end signal CSLDIS. The column selection end signal CSLDIS has a first delay amount relative to the column selection start signal CSLEN0T.

In some examples, a clock cycle of the column selection start signal CSLEN0T is 2T, and the first delay amount may be 1T, 2T, 3T, 4T, 5T, 6T, 7T, . . . , 10T, or 11T.

The control signal generation circuit 102 is configured to: receive the column selection start signal CSLEN0T, the column selection end signal CSLDIS, and a target bank group selection signal BG, and perform a first logical operation on the column selection start signal CSLEN0T and the target bank group selection signal BG to generate and output a target column selection start signal BG_CSLEN.

Each target bank group selection signal BG corresponds to one bank group. If the target bank group selection signal BG is active, it indicates that a bank group corresponding to the target bank group selection signal BG is selected for a read operation or a write operation. If the target bank group selection signal BG is inactive, a corresponding bank group is not selected.

The first logical operation is mainly intended for the following purpose: The column selection start signal CSLEN0T corresponds to all target bank groups (in other words, the column selection start signal is sent to each target bank group), and the column selection start signal CSLEN0T is sampled to output a target column selection start signal BG_CSLEN corresponding to a target bank group.

A target column selection window signal CSLSLV is further generated and output by the control signal generation circuit 102 based on the column selection start signal CSLEN0T and the target bank group selection signal BG.

The target column selection window signal CSLSLV has a second delay amount relative to the column selection start signal CSLEN0T, the second delay amount is less than or equal to the first delay amount, and active duration of the target column selection window signal CSLSLV is greater than or equal to the active duration of the target bank group selection signal BG.

It should be noted that the column control circuit operates in response to a read operation command. The active duration of the target column selection window signal CSLSLV is equal to the active duration of the target bank group selection signal BG only when consecutive read operation commands are received. Active duration of a target column selection window signal CSLSLV corresponding to the last read operation command is greater than the active duration of the target bank group selection signal BG in the case of non-consecutive read operation commands.

A second logical operation is further performed on the target column selection window signal CSLSLV and the column selection end signal CSLDIS by the control signal generation circuit 102, to generate and output a target column selection end signal BG_CSLDIS.

The second logical operation may be an AND operation.

For example, the active duration of the target bank group selection signal BG is 8T, and T is one clock cycle corresponding to one frequency. In this case, the active duration of the target column selection window signal CSLSLV is also 8T. The second delay amount t2 is less than the first delay amount t1. In this way, at all operating frequencies, to ensure sufficient duration (3 ns) for a column strobe signal of a corresponding bank group, even if the column selection end signal CSLDIS needs to be delayed by different delay amounts t1, it can be ensured that the corresponding target column selection window signal CSLSLV remains in an active state before the column selection end signal CSLDIS changes from active to inactive each time, to ensure that an active column selection end signal CSLDIS can be sampled by an active target column selection window signal CSLSLV to generate a target column selection end signal BG_CSLDIS whose active duration meets a requirement, thereby ensuring active duration of a column strobe signal of a corresponding bank group and ensuring correct transmission of data in a read operation or a write operation.

FIG. 2 is another functional block diagram of a column control circuit according to an embodiment of the present disclosure.

Referring to FIG. 2, the control signal generation circuit 102 may include multiple target signal generation circuits 112, each target signal generation circuit 112 corresponds to one bank group, and each bank group corresponds to one target bank group selection signal.

Different target bank group selection signals are denoted as BG_A, . . . and BG_H. Each target signal generation circuit 112 receives a corresponding target bank group selection signal. In other words, each target bank group selection signal is transmitted to a corresponding target signal generation circuit 112.

Each target signal generation circuit 112 corresponding to each bank group is configured to: receive the column selection start signal CSLEN0T, the column selection end signal CSDIS, and a target bank group selection signal BG corresponding to the bank group, and output a target column selection start signal, a target column selection window signal, and a target column selection end signal corresponding to the bank group.

A target column selection start signal, a target column selection window signal, and a target column selection end signal generated by a target signal generation circuit 112 receiving the target bank group selection signal BG_A are successively denoted as BGA_CSLEN, CSLSLV_A, and BGA_CSLDIS. A target column selection start signal, a target column selection window signal, and a target column selection end signal generated by a target signal generation circuit 112 receiving the target bank group selection signal BG_H are successively denoted as BGH_CSLEN, CSLSLV_H, and BGH_CSLDIS.

Figure 3:
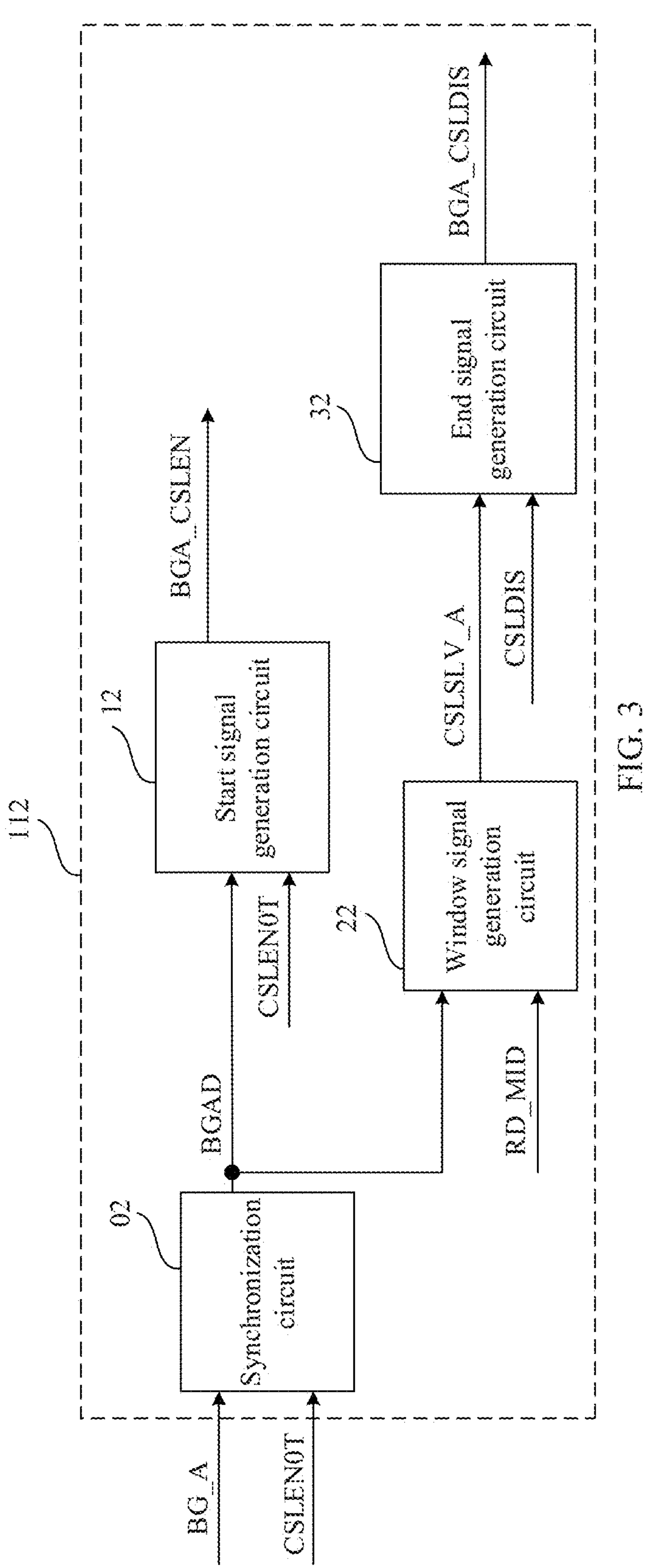
FIG. 3 is a functional block diagram of a target signal generation circuit according to an embodiment of the present disclosure.

FIG. 3 is a functional block diagram of a target signal generation circuit according to an embodiment of the present disclosure. In FIG. 3, the target signal generation circuit receiving the target bank group selection signal BG_A is taken as an example. Referring to FIG. 3, the target signal generation circuit 112 includes a synchronization circuit 02, a start signal generation circuit 12, a window signal generation circuit 22, and an end signal generation circuit 32.

The synchronization circuit 02 is configured to: receive the target bank group selection signal BG_A and the column selection start signal CSLEN0T, and sample the target bank group selection signal BG_A in response to the column selection start signal CSLEN0T, to generate and output a target bank group synchronization signal BGAD. A target bank group synchronization signal BGAD in an active state is output when the target bank group selection signal BG_A is in an active state and the column selection start signal CSLEN0T changes from inactive to active, and a target bank group synchronization signal BGAD in an inactive state is output when the target bank group selection signal BG_A is in an inactive state and the column selection start signal CSLEN0T changes from inactive to active.

The synchronization circuit 02 has the following functions: In an ideal case, an active start moment of the target bank group selection signal BG_A is aligned with an active start moment of the column selection start signal CSLEN0T. However, because transmission delays of different signals on respective transmission paths are different, the active start moment of the column selection start signal CSLEN0T may be later than the active start moment of the target bank group selection signal BG_A, in other words, there is a small delay between the column selection start signal CSLEN0T and the target bank group selection signal BG_A. To eliminate this small delay, the synchronization circuit 02 may shift the received target bank group selection signal BG_A to generate the target bank group synchronization signal BGAD. An active start moment of the target bank group synchronization signal BGAD is synchronous with the active start moment of the column selection start signal CSLEN0T.

Figure 4:
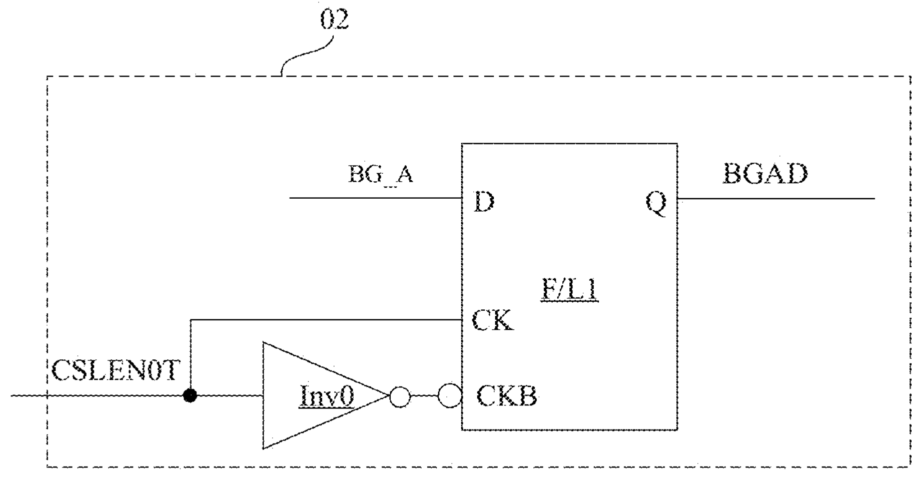
FIG. 4 is a schematic diagram of a circuit structure of a synchronization circuit according to an embodiment of the present disclosure.

FIG. 4 is a schematic diagram of a circuit structure of a synchronization circuit according to an embodiment of the present disclosure.

Referring to FIG. 4, the synchronization circuit 02 may include a first D flip-flop F/L1, the target bank group selection signal BG_A is received by a data input terminal of the first D flip-flop F/L1, the column selection start signal CSLEN0T is received by a clock terminal thereof, and the target bank group synchronization signal BGAD is output by a non-inverting output terminal thereof.

The synchronization circuit 02 may further include a $0^{th}$ inverter Inv0. The target column selection start signal CSLEN0T is received by an input terminal of the $0^{th}$ inverter, and an output terminal thereof is connected to an inverting clock trigger terminal of the first D flip-flop F/L1.

Continuing to refer to FIG. 3, the start signal generation circuit 12 is configured to: receive the target bank group synchronization signal BGAD and the column selection start signal CSLEN0T, and perform an AND operation to generate and output the target column selection start signal BGA_CSLEN.

Figure 5:
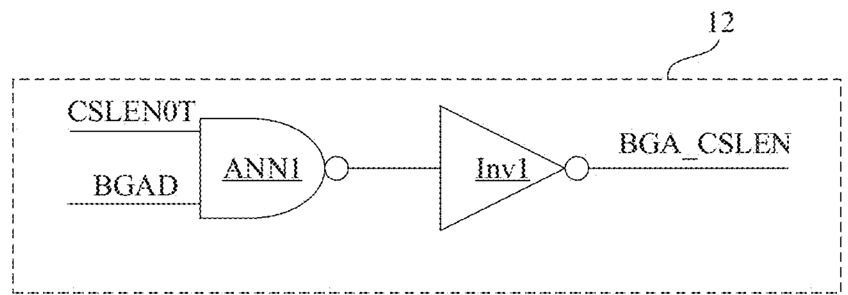
FIG. 5 is a schematic diagram of a circuit structure of a start signal generation circuit according to an embodiment of the present disclosure.

FIG. 5 is a schematic diagram of a circuit structure of a start signal generation circuit according to an embodiment of the present disclosure. Referring to FIG. 5, the start signal generation circuit 12 may include a first NAND gate ANN1 and a first inverter Inv1.

The target bank group synchronization signal BGAD and the column selection start signal CSLEN0T are respectively received by two input terminals of the first NAND gate ANN1. An input terminal of the first inverter Inv1 is connected to an output terminal of the first NAND gate ANN1, and the target column selection start signal BGA_CSLEN is output by an output terminal of the first inverter.

Continuing to refer to FIG. 3, the window signal generation circuit 22 is configured to: receive the target bank group synchronization signal BGAD and a trigger signal RD_MID, and perform delay processing on the target bank group synchronization signal BGAD based on the trigger signal RD_MID, to generate and output the target column selection window signal CSLSLV_A. The trigger signal RD_MID has a third delay amount relative to the column selection start signal CSLEN0T, and the third delay amount is equal to the second delay amount.

The target column selection window signal CSLSLV_A is active from a moment at which the trigger signal RD_MID starts to be in an active state to a moment at which an active state of a next trigger signal RD_MID arrives. When an address of a next read/write operation is not the current BG (BG_A corresponding to the next trigger signal RD_MID is in an inactive state), the target bank group synchronization signal BGAD changes to an inactive level, and the target column selection window signal CSLSLV_A changes from active to inactive at the moment at which the next trigger signal RD_MID starts to be in an active state. When an address of a next read/write operation is still the current BG (BG_A corresponding to the next trigger signal RD_MID remains in an active state), the target bank group synchronization signal BGAD remains at an active level, and the target column selection window signal CSLSLV_A remains in an active state at the moment at which the next trigger signal RD_MID starts to be in an active state.

Figure 6:
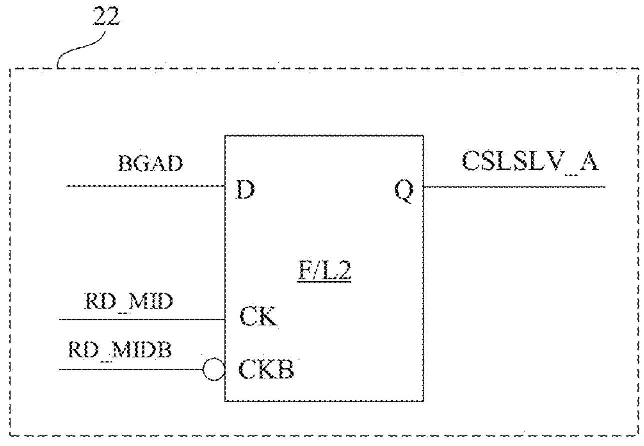
FIG. 6 is a schematic diagram of a circuit structure of a window signal generation circuit according to an embodiment of the present disclosure.

In some examples, the trigger signal RD_MID may be related to the column selection start signal. For example, the trigger signal RD_MID may be a delay signal of the column selection start signal CSLEN0T, in other words, the column selection start signal CSLEN0T is delayed to obtain the trigger signal RD_MID. In some other examples, the trigger signal RD_MID may alternatively be related to a read operation command or a write operation command. For example, the read operation command is delayed to generate the trigger signal RD_MID, or the write operation command is delayed to generate the trigger signal RD_MID. FIG. 6 is a schematic diagram of a circuit structure of a window signal generation circuit according to an embodiment of the present disclosure. Referring to FIG. 6, the window signal generation circuit 22 may include a second D flip-flop F/L2. The target bank group synchronization signal is received by a data input terminal of the second D flip-flop F/L2, the trigger signal RD_MID is received by a clock terminal of the second D flip-flop F/L2, and the target column selection window signal CSLSLV_A is output by a non-inverting output terminal of the second D flip-flop F/L2.

The second D flip-flop F/L2 may further have an inverting clock terminal for receiving an inverted trigger signal RD_MIDB. A level and a phase of the inverted trigger signal RD_MIDB are opposite to a level and a phase of the trigger signal RD_MID.

Continuing to refer to FIG. 3, the end signal generation circuit 32 may be configured to: receive the target column selection window signal CSLSLV_A and the column selection end signal CSLDIS, and perform an AND logical operation to generate and output the target column selection end signal BGA_CSLDIS.

Figure 7:
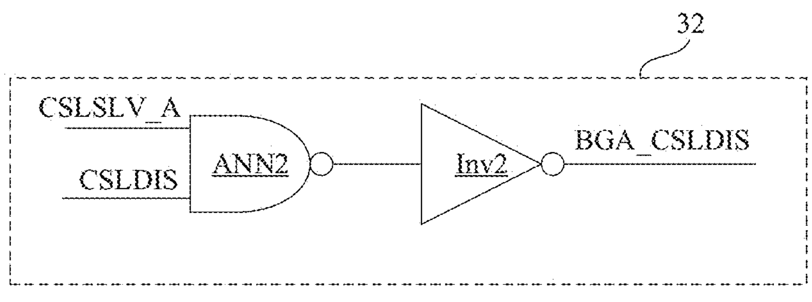
FIG. 7 is a schematic diagram of a circuit structure of an end signal generation circuit according to an embodiment of the present disclosure.

FIG. 7 is a schematic diagram of a circuit structure of an end signal generation circuit according to an embodiment of the present disclosure. Referring to FIG. 7, the end signal generation circuit 32 may include a second NAND gate ANN2 and a second inverter Inv2.

The target column selection window signal CSLSLV_A is received by one input terminal of the second NAND gate ANN2, and the column selection end signal CSLDIS is received by the other input terminal thereof.

An input terminal of the second inverter Inv2 is connected to an output terminal of the second NAND gate ANN2, and the target column selection end signal BGA_CSLDIS is output by an output terminal of the second inverter.

Figure 8:
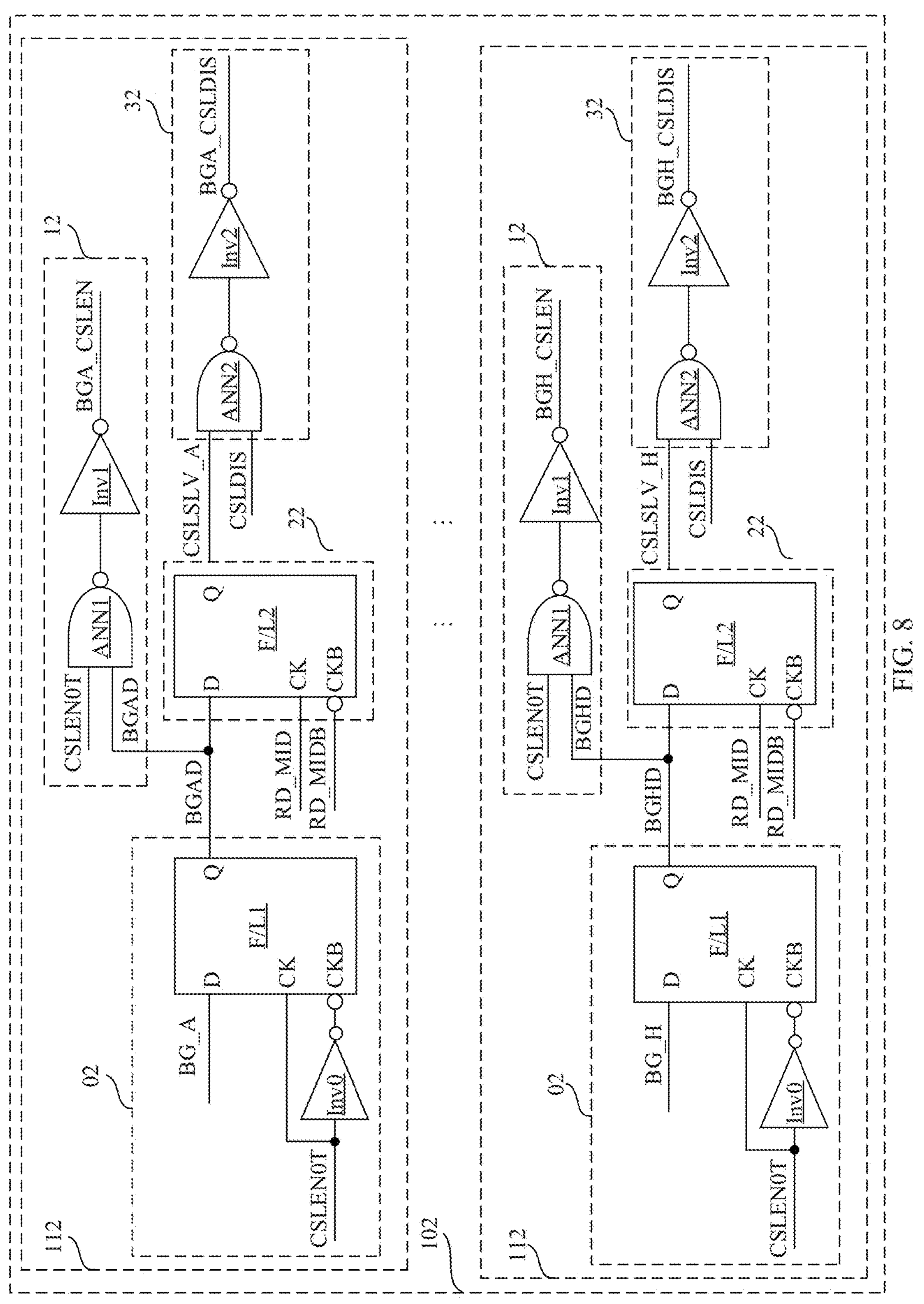
FIG. 8 is a schematic diagram of a circuit structure of a control signal generation circuit according to an embodiment of the present disclosure.

FIG. 8 is a schematic diagram of a circuit structure of a control signal generation circuit according to an embodiment of the present disclosure.

Figures 9, 10:
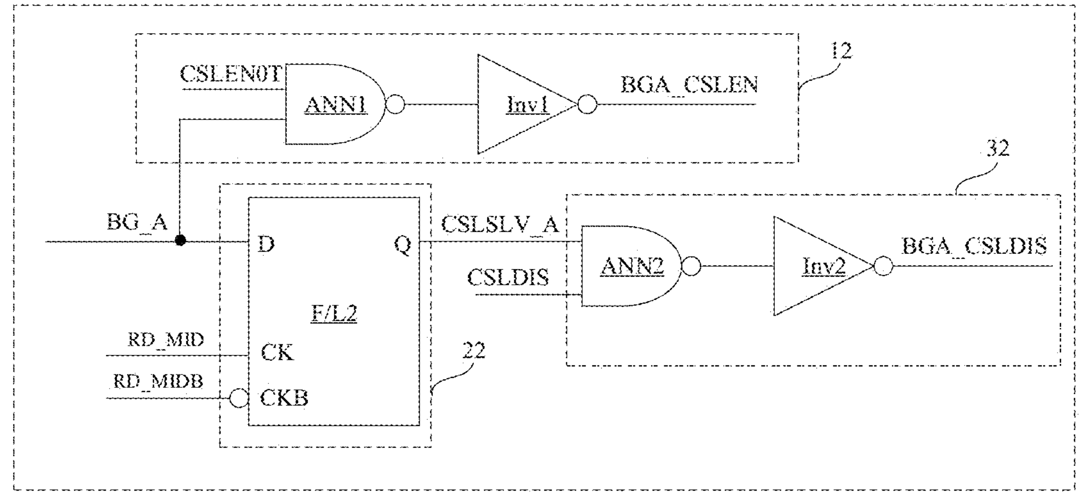
FIG. 9 is another schematic diagram of a circuit structure of a target signal generation circuit according to an embodiment of the present disclosure.
FIG. 10 is a functional block diagram of a delay control circuit according to an embodiment of the present disclosure.

FIG. 9 is another schematic diagram of a circuit structure of a target signal generation circuit according to an embodiment of the present disclosure. It may be understood that in some embodiments, the synchronization circuit shown in FIG. 8 may not be disposed, and the target bank group selection signal BG_A may be received by the start signal generation circuit 12 and the window signal generation circuit 22.

In some embodiments, the trigger signal RD_MID may be obtained by delaying the column selection start signal CSLEN0T by the third delay amount. The third delay amount is less than or equal to the first delay amount. In this way, it is ensured that at any operating frequency, the column selection end signal CSLDIS can be sampled by the target column selection window signal CSLSLV_A, in other words, an active state of the column selection end signal falls within a time period corresponding to an active state of the corresponding target column selection window signal CSLSLV_A.

Specifically, an active start moment of the target column selection window signal is the same as an active start moment of the trigger signal RD_MID. The third delay amount corresponding to the trigger signal RD_MID can be properly set to ensure that the active start moment of the column selection end signal can always be sampled by the target column selection window signal.

In addition, the active duration of the target column selection window signal is greater than or equal to the active duration of the target bank group selection signal, in other words, a pulse width of the target column selection window signal is greater than or equal to a pulse width of the target bank group selection signal. In this way, the target column selection window signal has a larger pulse width, to ensure that an active end moment of the column selection end signal can always be sampled by the target column selection window signal.

FIG. 10 is a functional block diagram of a delay control circuit according to an embodiment of the present disclosure. Referring to FIG. 10, the delay control circuit 101 may be further configured to perform delay processing on the column selection start signal CSLEN0T to generate and output the trigger signal RD_MID.

Figure 11:
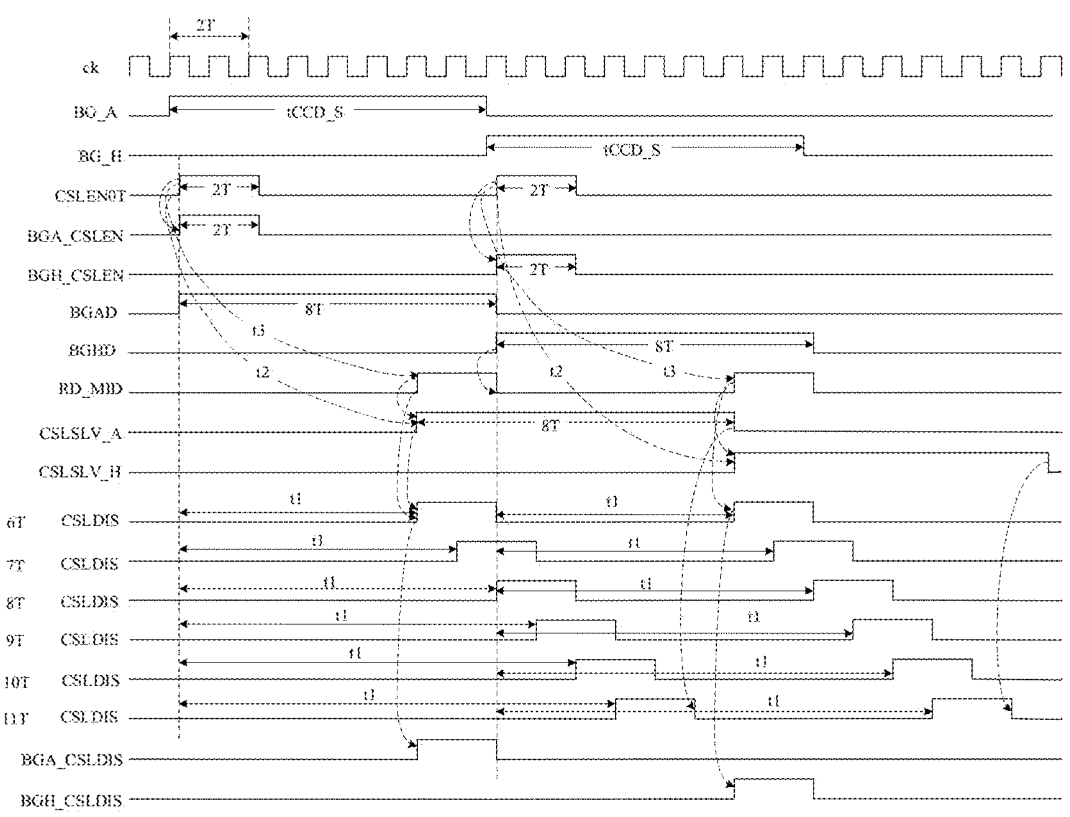
FIG. 11 is a time sequence diagram of signals in a column control circuit according to an embodiment of the present disclosure.
Figure 12:
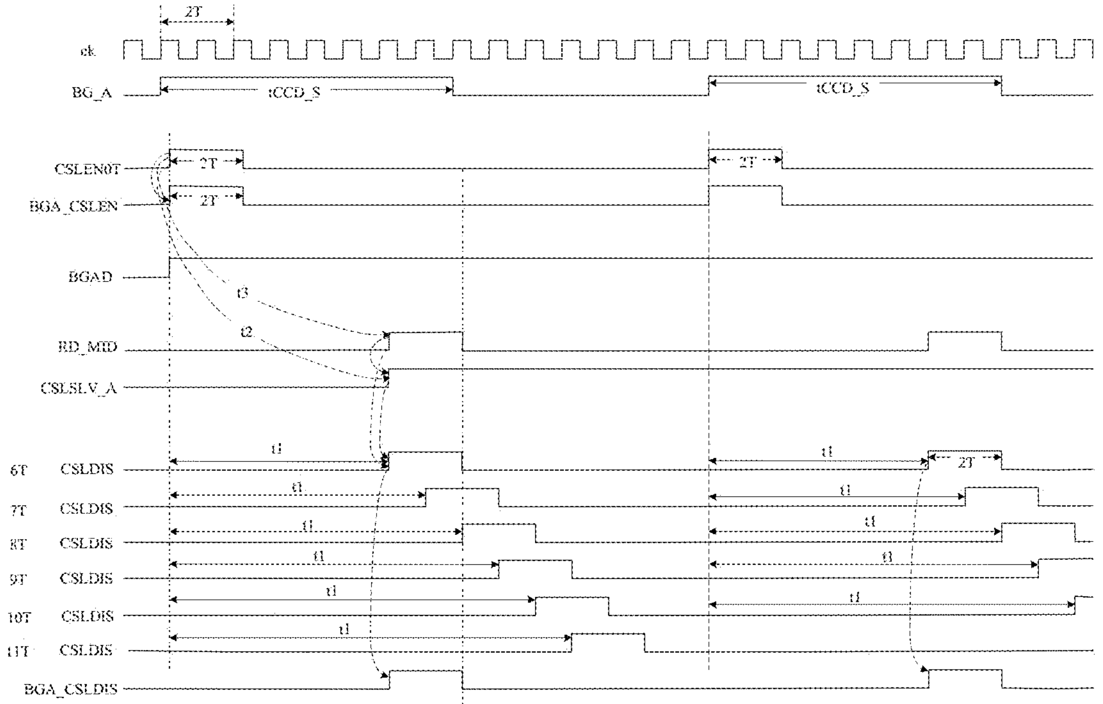
FIG. 12 is another time sequence diagram of signals in a column control circuit according to an embodiment of the present disclosure.

FIG. 11 and FIG. 12 are two different time sequence diagrams of signals in a column control circuit according to an embodiment of the present disclosure.

Referring to FIG. 11 and FIG. 12, ck represents a clock signal, and a clock cycle of ck is 1T. The target bank group selection signals BG_A and BG_H are successively active, and active duration of each of the target bank group selection signals BG_A and BG_H is a second delay time tCCD_S, the second delay time tCCD_S may be 8T, and a clock cycle of the column selection start signal CSLEN0T may be 2T.

In FIG. 11, two consecutive target bank group selection signals are respectively directed at different target bank groups. Taking the target bank group selection signals BG_A and BG_H as examples, corresponding target reset signals BGA_RSTB and BGH_RSTB are the same as a reset signal RSTB.

In FIG. 12, two consecutive target bank group selection signals are separately directed at the same target bank group. For example, the two consecutive target bank group selection signals are BG_A. As shown in FIG. 12, because a next target bank group selection signal BG_A arrives when a next column selection start signal CSLEN0T arrives, before and after the next target bank group selection signal BG_A arrives, a corresponding target bank group synchronization signal BGAD always remains in an active state, and BGAD sampled by a next trigger signal RD_MID is also in an active state, in other words, a target column selection window signal CSLSLV_A generated based on a current target bank group selection signal BG_A remains in an active state. In this way, active duration of the target column selection window signal CSLSLV_A is greater than 8T.

The first column selection start signal CSLEN0T may have a delay relative to the target bank group selection signal BG_A, and the second column selection start signal CSLEN0T may have a delay relative to the target bank group selection signal BG_H.

The column selection end signal CSLDIS has the first delay amount t1 relative to the column selection start signal CSLEN0T, the trigger signal RD_MID has the third delay amount t3 relative to the column selection start signal CSLEN0T, and the target column selection window signal CSLSLV_A has the second delay amount t2 relative to the column selection start signal CSLEN0T. The second delay amount t2 is equal to the third delay amount t3.

In some embodiments, referring to FIG. 11, the first delay amount t1 is adjustable, and correspondingly, the third delay amount t3 is less than or equal to a minimum value of the first delay amount t1.

In some examples, the first delay amount and the second delay amount meet: $2 \leq tCCD\_S-2T$ and $t2 \leq t1 \leq t2+tCCD\_S-2T$, where t1 is the first delay amount, t2 is the second delay amount, 2T is active duration of the column selection start signal CSLEN0T, T is one clock cycle, and tCCD_S is the active duration of the target bank group selection signal BG_A.

The second delay amount t2 and the third delay amount t3 may be determined based on an actual requirement. For example, the active duration of the target bank group selection signal BG_A is 8T, and a pulse width of the column selection start signal is 2T. If the minimum value of the first delay amount t1 is 6T, the third delay amount t3 is less than or equal to 6T. If a maximum value of the first delay amount is 11T, to ensure that the column selection end signal CSLDIS can be sampled by the target column selection window signal CSLSLV_A, the third delay amount t3 is greater than or equal to (11T+2T)−8T, in other words, the third delay amount t3 is greater than or equal to 5T.

In this way, if the first delay amount t1 meets: 6T≤t1≤11T, and t1 is adjustable, 5T≤t3≤6T, and correspondingly, 5T≤t2≤6T.

In another example, if the minimum value of the first delay amount t1 is 5T, the third delay amount t3 is less than or equal to 5T. If a maximum value of the first delay amount is 11T, to ensure that the column selection end signal CSLDIS can be sampled by the target column selection window signal CSLSLV_A, the third delay amount t3 is greater than or equal to (11T+2T)−8T, in other words, the third delay amount t3 is greater than or equal to 5T.

In this way, if the first delay amount t1 meets: 5T≤t1≤11T, and t1 is adjustable, both t3 and t1 are 5T.

In still another example, if the minimum value of the first delay amount t1 is 7T, the third delay amount t3 is less than or equal to 7T. If a maximum value of the first delay amount is 10T, to ensure that the column selection end signal CSLDIS can be sampled by the target column selection window signal CSLSLV_A, the third delay amount t3 is greater than or equal to (10T+2T)−8T, in other words, the third delay amount t3 is greater than or equal to 4T.

In this way, if the first delay amount t1 meets: 7T≤t1≤11T, and t1 is adjustable, 4T≤t3≤7T, and correspondingly, 4T≤t2≤7T.

It should be noted that in some examples, the first delay amount may alternatively be a fixed value. For a relationship between the third delay amount and the first delay amount, reference may also be made to the foregoing descriptions. For example, when the first delay amount is 6T, the third delay amount may be 0T or 1T. When the first delay amount is 11T, the third delay amount may be 5T or 6T.

In addition, the third delay amount t3 may be a fixed value. In some examples, the third delay amount t3 is also adjustable, and the second delay amount t2 changes with the third delay amount t3.

Figure 13:
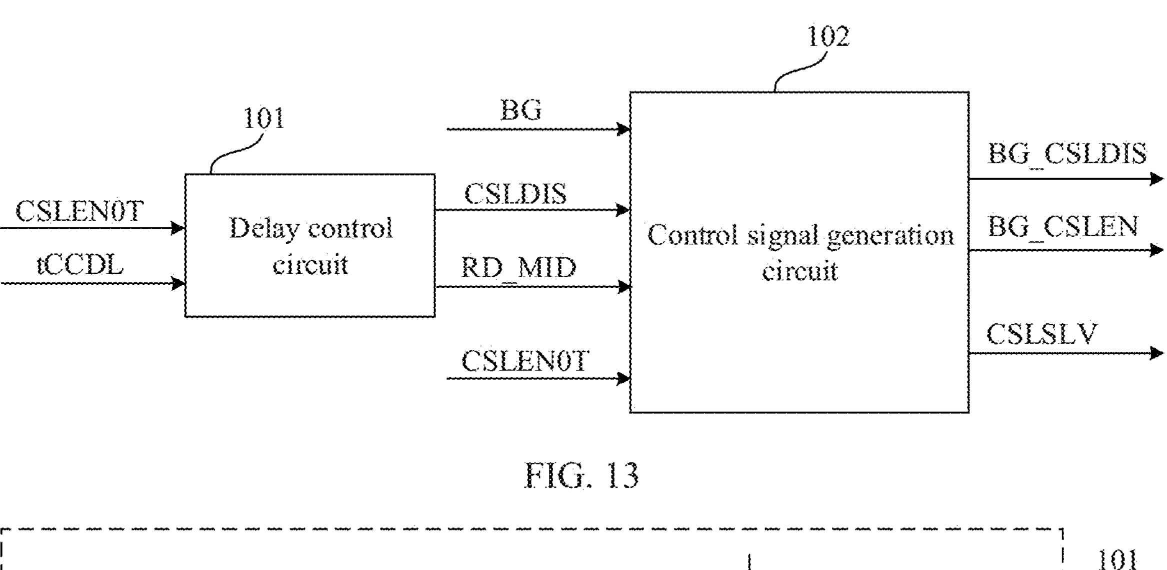
FIG. 13 is still another functional block diagram of a column control circuit according to an embodiment of the present disclosure.

FIG. 13 is still another functional block diagram of a column control circuit according to an embodiment of the present disclosure. Referring to FIG. 13, the delay control circuit 101 is further configured to: receive a delay selection signal tCCDL, and adjust the first delay amount based on the delay selection signal tCCDL.

As shown in FIG. 11, t1 may be 6T, 7T, 8T, 9T, 10T, or 11T.

In some examples, on the premise that a time in which the column strobe signal is enabled is greater than or equal to 3 ns, the first delay amount t1 may be determined with a correspondence shown in Table 1.

TABLE 1

| Multiple of a first delay time tCCD_L relative to tCK/Quantity of clock cycles | Operating frequency (MHz) | tCK (ns) | Delay selection signal tCCDL | Multiple of a first delay amount t1 relative to tCK | First delay amount t1 |
|---|---|---|---|---|---|
| 8 | 3200 | 0.625 | tCCDL8 = 1 | 6 | 3.750 |
| 9 | 3600 | 0.556 | tCCDL9 = 1 | 6 | 3.333 |
| 10 | 4000 | 0.500 | tCCDL10 = 1 | 7 | 3.500 |
| 11 | 4400 | 0.455 | tCCDL11 = 1 | 8 | 3.636 |
| 12 | 4800 | 0.417 | tCCDL12 = 1 | 9 | 3.750 |
| 13 | 5200 | 0.385 | tCCDL13 = 1 | 9 | 3.462 |
| 14 | 5600 | 0.357 | tCCDL14 = 1 | 10 | 3.571 |
| 15 | 6000 | 0.333 | tCCDL15 = 1 | 11 | 3.667 |
| 16 | 6400 | 0.313 | tCCDL16 = 1 | 11 | 3.438 |

Referring to Table 1, a larger operating frequency indicates smaller tCK. The correspondence shown in Table 1 exists between the quantity of clock cycles of the first delay time tCCD_L, the operating frequency, the multiple of the first delay amount t1 relative to the tCK, and the first delay amount t1.

According to the relationship in Table 1, the quantity of clock cycles of the first delay time tCCD_L that is fixed (e.g., at 5 ns) changes with the operating frequency (because the first delay time tCCD_L is equal to the quantity of clock cycles multiplied by tCK and tCK decreases as the operating frequency increases), to be specific, the operating frequency may be indicated by the quantity of clock cycles of the first delay time tCCD_L to determine a value of the delay selection signal tCCDL, and specific values of the first delay amount t1 at different operating frequencies may be selected based on the value of the delay selection signal tCCDL.

In Table 1, the quantity of clock cycles of the first delay time tCCD_L is any natural number between 8 and 16. Once a value of the quantity of clock cycles of the first delay time tCCD_L is determined, the value of the delay selection signal tCCDL is also determined, and a correspondingly selected first delay amount is also determined.

In Table 1, a correspondence between the quantity of clock cycles of the first delay time tCCD_L and the value of the delay selection signal tCCDL may be implemented with a decoder, to be specific, the quantity of clock cycles of the first delay time tCCD_L serves as input of the decoder, and the value of the delay selection signal tCCDL serves as output of the decoder.

The value of the delay selection signal tCCDL in Table 1 is related to a binary value formed by the following p bits of control codes. Once the value of the delay selection signal tCCDL is determined, a value of each bit of control code in the p bits of control codes is also determined. When the value of the delay selection signal tCCDL is determined, only 1 bit of control code in the following p bits of control codes tCCDL8 to tCCDL16 is 1, and all remaining control codes are 0.

Figure 14:
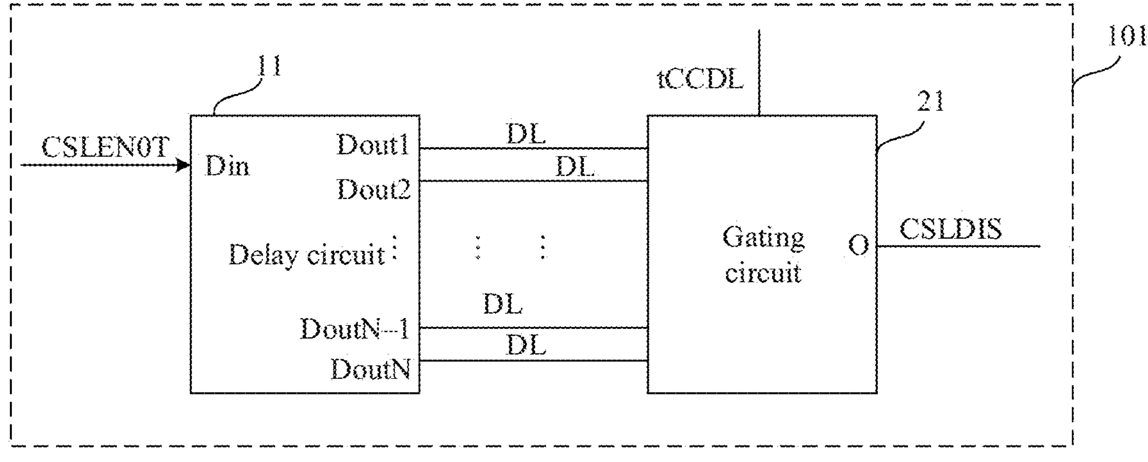
FIG. 14 is a functional block diagram of a delay control circuit according to an embodiment of the present disclosure.

FIG. 14 is a functional block diagram of a delay control circuit according to an embodiment of the present disclosure. Referring to FIG. 13 and FIG. 14, the delay control circuit 101 may include a delay circuit 11 and a gating circuit 21.

The delay circuit 11 has an input node Din and N output nodes Dout1 to DoutN, and the N output nodes are respectively denoted as Dout1, Dout2, . . . , DoutN-1, and DoutN. The delay circuit 11 is configured to: receive the column selection start signal CSLEN0T through the input node Din, and output N delay signals DL through the N output nodes Dout1 to DoutN. The N output nodes Dout1 to DoutN include the first output node to the $N^{th}$ output node arranged in ascending order of natural numbers, delay amounts of the N delay signals DL respectively output by the first output node to the $N^{th}$ output node relative to the column selection start signal CSLEN0T successively increment, and N is a natural number greater than or equal to 2.

The delay amounts of the delay signals DL relative to the column selection start signal CSLEN0T may be successively 1T, 2T, 3T, 4T, 5T, 6T, 7T, 8T, 9T, 10T, and I1T. The N delay signals DL may be respectively CSLEN1T, CSLEN2T, CSLEN3T, . . . CSLENnT, . . . , and CSLENNT, where CSLENnT has a delay amount of nT relative to the column selection start signal CSLEN0T, and n is a positive integer less than or equal to N. A delay amount of a delay signal DL output by an output node Doutn relative to the column selection start signal CSLEN0T is nT.

Figure 15:
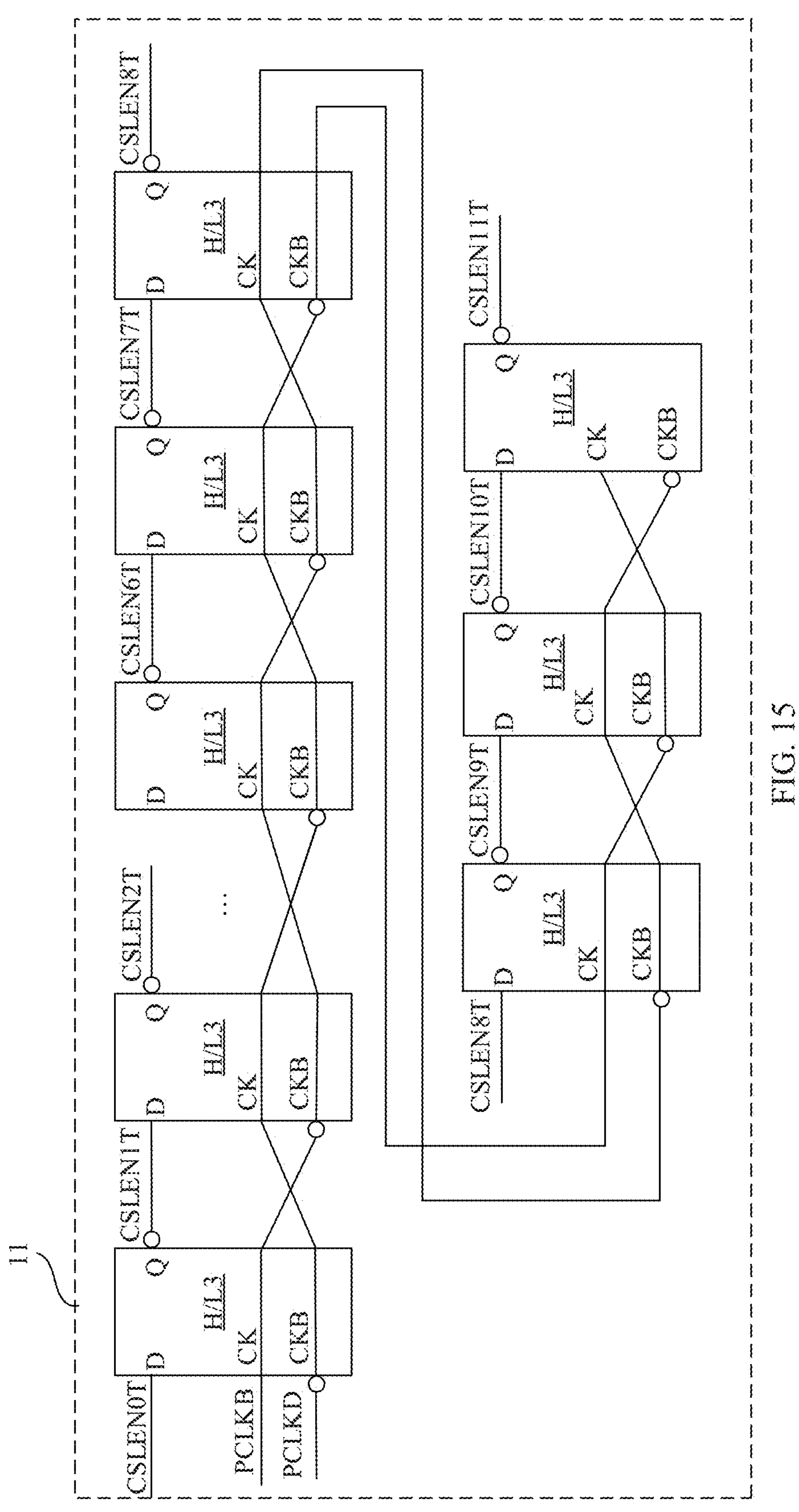
FIG. 15 is a schematic diagram of a circuit structure of a delay circuit according to an embodiment of the present disclosure.

FIG. 15 is a schematic diagram of a circuit structure of a delay circuit according to an embodiment of the present disclosure. Referring to FIG. 14 and FIG. 15 together, the delay circuit 11 may include N cascaded first D latches H/L3, a data input terminal of a first-stage first D latch H/L3 serves as the input node Din, and an inverting output terminal of a current-stage first D latch H/L3 is connected to a data input terminal of a next-stage first D latch H/L3; wherein the first D latch is a type of half latch.

A clock signal PCLKB is received by a clock terminal of each first D latch H/L3 at an odd-numbered location, an inverted clock signal PCLKD is received by a clock terminal of each first D latch H/L3 at an even-numbered location, the inverted clock signal PCLKD and the clock signal PCLKB are inverted signals of each other, and inverting output terminals of the N first D latches H/L3 serve as the N output nodes Dout1 to DoutN.

Specifically, an inverting output terminal of the first-stage first D latch H/L3 serves as the output node Dout1, an inverting output terminal of a second-stage first D latch H/L3 serves as the output node Dout2, and by analogy, an inverting output terminal of an $Nt^{h}$_stage first D latch H/L3 serves as the output node DoutN.

Correspondingly, an active level of a delay signal output by an inverting output terminal of the first D latch H/L3 at the odd-numbered location is opposite to an active level of the column selection start signal CSLEN0T, and an active level of a delay signal output by an inverting output terminal of the first D latch H/L3 at the even-numbered location is the same as the active level of the column selection start signal CSLEN0T.

Active levels of the delay signals CSLENIT, CSLEN3T, CSLEN5T, and the like are opposite to the active level of the column selection start signal CSLEN0T, and active levels of the delay signals CSLEN2T, CSLEN4T, CSLEN6T, and the like are the same as the active level of the column selection start signal CSLEN0T.

In some embodiments, the delay circuit 11 may be further configured to: in response to a read operation command, generate the column selection start signal CSLEN0T, and provide the column selection start signal CSLEN0T for the input node Din.

It may be understood that the delay circuit 11 may be further configured to: in response to a write operation command, generate the column selection start signal CSLEN0T, and provide the column selection start signal CSLEN0T for the input node Din.

If an operation performed on the bank group is a read operation, the column selection start signal CSLEN0T is generated based on the read operation command. If an operation performed on the bank group is a write operation, the column selection start signal CSLEN0T is generated based on the write operation command.

Figure 16:
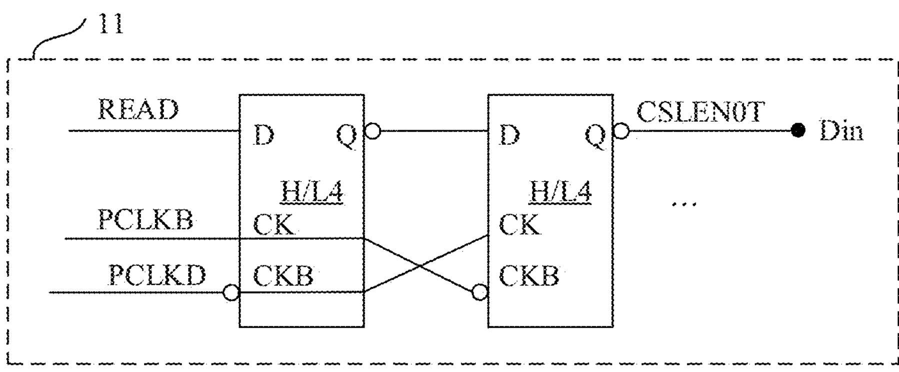
FIG. 16 is a schematic diagram of a circuit structure of a delay circuit according to an embodiment of the present disclosure.

FIG. 16 is a schematic diagram of a circuit structure of a delay circuit according to an embodiment of the present disclosure. Referring to FIG. 16, the delay circuit 11 may include an even number of cascaded second D latches H/L4; wherein the second D latch is a type of half latch.

The read operation command READ or the write operation command is received by a data input terminal of a first-stage second D latch H/L4, and an inverting output terminal of a current-stage second D latch H/L4 is connected to a data input terminal of a next-stage second D latch H/L4.

The clock signal PCLKB is received by a clock terminal of each second D latch H/L4 at an odd-numbered location, the inverted clock signal PCLKD is received by a clock terminal of each second D latch H/L4 at an even-numbered location, the inverted clock signal PCLKD and the clock signal PCLKB are inverted signals of each other, and an inverting output terminal of a last-stage second D latch is connected to the input node Din and outputs the column selection start signal CSLEN0T.

It should be noted that FIG. 16 illustrates two second D latches H/L4, and actually, the delay circuit 11 may have four, six, or another even number of second D latches H/L4.

Continuing to refer to FIG. 14, the gating circuit 21 is connected to m output nodes, has a gating output terminal O, and is configured to gate a transmission path between one of the m output nodes and the gating output terminal O in response to the delay selection signal tCCDL, to output the column selection end signal CSLDIS through the gating output terminal O, where m is a natural number less than or equal to N.

Figure 17:
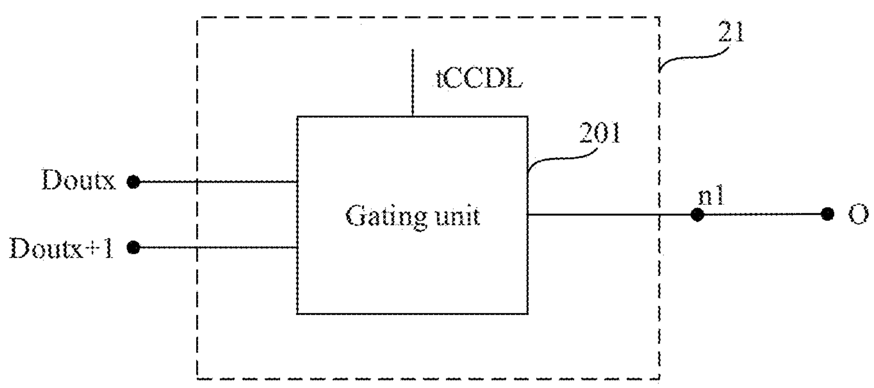
FIG. 17 is a functional block diagram of a gating circuit according to an embodiment of the present disclosure.
Figure 18:
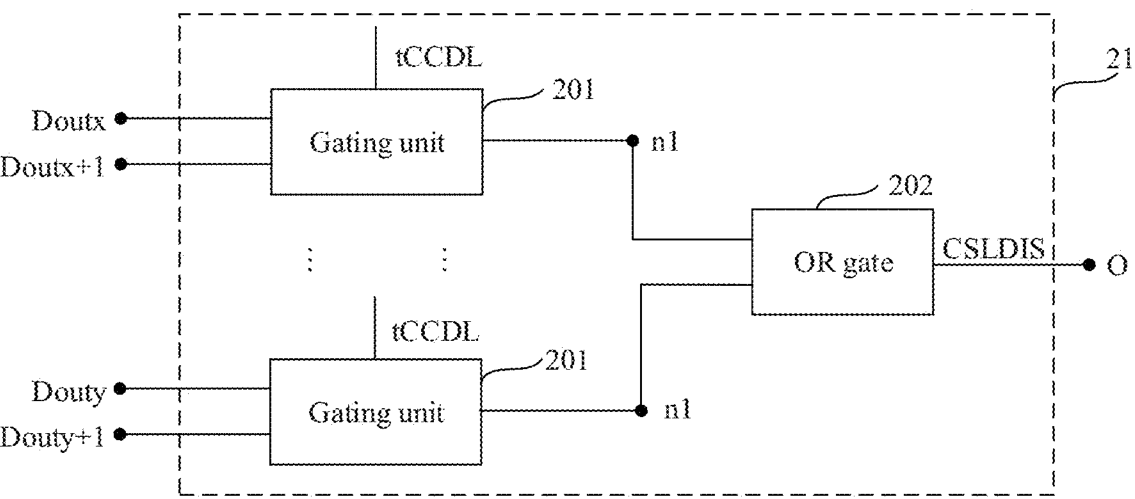
FIG. 18 is another functional block diagram of a gating circuit according to an embodiment of the present disclosure.

FIG. 17 and FIG. 18 are two different functional block diagrams of a gating circuit according to an embodiment of the present disclosure.

Referring to FIG. 17, the gating circuit 21 may include at least one gating unit 201, and each of the at least one gating unit 201 is connected to two corresponding and adjacent output nodes in the m output nodes. Each gating unit 201 is configured to gate a transmission path between one of the two output nodes and an output terminal n1 of the gating unit 201 in response to the delay selection signal tCCDL. The two adjacent output nodes are respectively denoted as Doutx and Doutx+1, where x+1 is greater than 2 and is less than or equal to N, and x is a positive integer.

The output terminal n1 of the gating unit 201 may be directly connected to the gating output terminal O.

In addition, it may be understood that in some examples, active levels of delay signals output by the two adjacent output nodes are opposite to each other. The two output nodes are respectively defined as a first output node and a second output node. An active level of a delay signal output by the first output node is the same as the active level of the column selection start signal CSLEN0T, and an active level of a delay signal output by the second output node is opposite to the active level of the column selection start signal CSLEN0T. The first output node is directly connected to the output terminal O when the first output node is gated. The second output node and the output terminal O are connected to each other through an inverter when the second output node is gated. The active level of the delay signal output by the second output node may be flipped by the inverter.

Referring to FIG. 18, the gating circuit 21 may include two or more gating units 201, and output nodes connected to different gating units 201 are different.

The gating circuit 21 further includes an OR gate 202, an input terminal of the OR gate 202 is connected to an output terminal n1 of each gating unit 201, and an output terminal of the OR gate 202 serves as the gating output terminal O. Two adjacent output nodes connected to another gating unit 201 are respectively denoted as Douty and Douty+1, where 2<y+1≤N, and x, x+1, y, and y+1 are different from each other.

Figure 19:
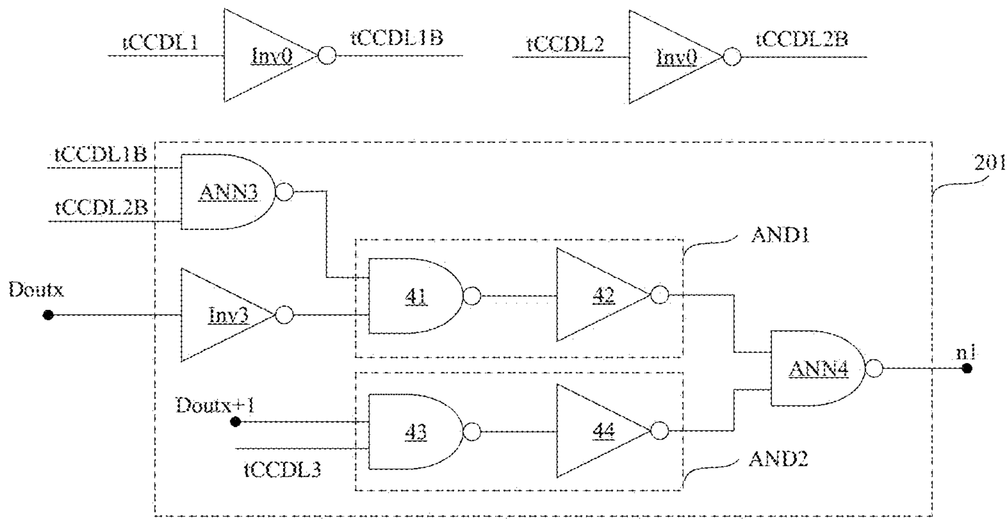
FIG. 19 is a schematic diagram of a circuit structure of any gating unit according to an embodiment of the present disclosure.

FIG. 19 is a schematic diagram of a circuit structure of any gating unit according to an embodiment of the present disclosure. Referring to FIG. 19, the delay selection signal tCCDL includes p bits of control codes, and each gating unit 201 receives three corresponding and adjacent control codes, where p is a natural number greater than or equal to 3, and active levels of delay signals output by two adjacent output nodes are opposite to each other. Each bit of control code may be 0 or 1.

The delay selection signal may be a binary signal, and the quantity of p bits is the quantity of binary bits. A value of the control code is 0 or 1.

Referring to FIG. 19, each gating unit 201 may include a third NAND gate ANN3, a third inverter Inv3, a first AND gate AND1, a second AND gate AND2, and a fourth NAND gate ANN4.

Each of two input terminals of the third NAND gate ANN3 receives an inverted signal of one of the three control codes, and inverted signals of control codes received by the third NAND gate ANN3 are respectively denoted as tCCDL1B and tCCDL2B. tCCDL1B is an inverted signal of a control code tCCDL1, and tCCDL2B is an inverted signal of a control code tCCDL2. FIG. 19 further illustrates a relationship between tCCDL1, tCCDL1B, tCCDL2, and tCCDL2B, and the control code is inverted by the $0^{th}$ inverter Inv0 to output a corresponding inverted signal.

An input terminal of the third inverter Inv3 is connected to an output node Doutx.

Two input terminals of the first AND gate AND1 are respectively connected to an output terminal of the third NAND gate ANN3 and an output terminal of the third inverter Inv3.

The first AND gate AND1 may include a first sub-NAND gate 41 and a first sub-inverter 42.

Two input terminals of the first sub-NAND gate 41 serve as the two input terminals of the first AND gate AND1, an output terminal of the first sub-NAND gate 41 is connected to an input terminal of the first sub-inverter 42, and an output terminal of the first sub-inverter 42 serves as an output terminal of the first AND gate AND1.

The remaining one of the three control codes is received by one input terminal of the second AND gate AND2, and the other input terminal thereof is connected to another output node. The control code received by the second AND gate AND2 is denoted as tCCDL3.

The second AND gate AND2 may include a second sub-NAND gate 43 and a second sub-inverter 44.

Two input terminals of the second sub-NAND gate 43 serve as the two input terminals of the second AND gate AND2, an output terminal of the second sub-NAND gate 43 is connected to an input terminal of the second sub-inverter 44, and an output terminal of the second sub-inverter 44 serves as an output terminal of the second AND gate AND2.

An input terminal of the fourth NAND gate ANN4 is connected to the output terminal of the first AND gate AND1 and the output terminal of the second AND gate AND2, and an output terminal of the fourth NAND gate ANN4 serves as the output terminal n1 of the gating unit 201.

It should be noted that a specific circuit related to the gating unit 201 may meet the following logical requirements:

An output node providing a delay signal with the same active level as the column selection start signal CSLEN0T is connected to a corresponding AND gate through an inverter, and the AND gate may be one of the first AND gate AND1 and the second AND gate AND2. An output node providing a delay signal with an opposite active level to the column selection start signal CSLEN0T is directly connected to a corresponding AND gate, and the AND gate may be one of the first AND gate AND1 and the second AND gate AND2.

Figure 20:
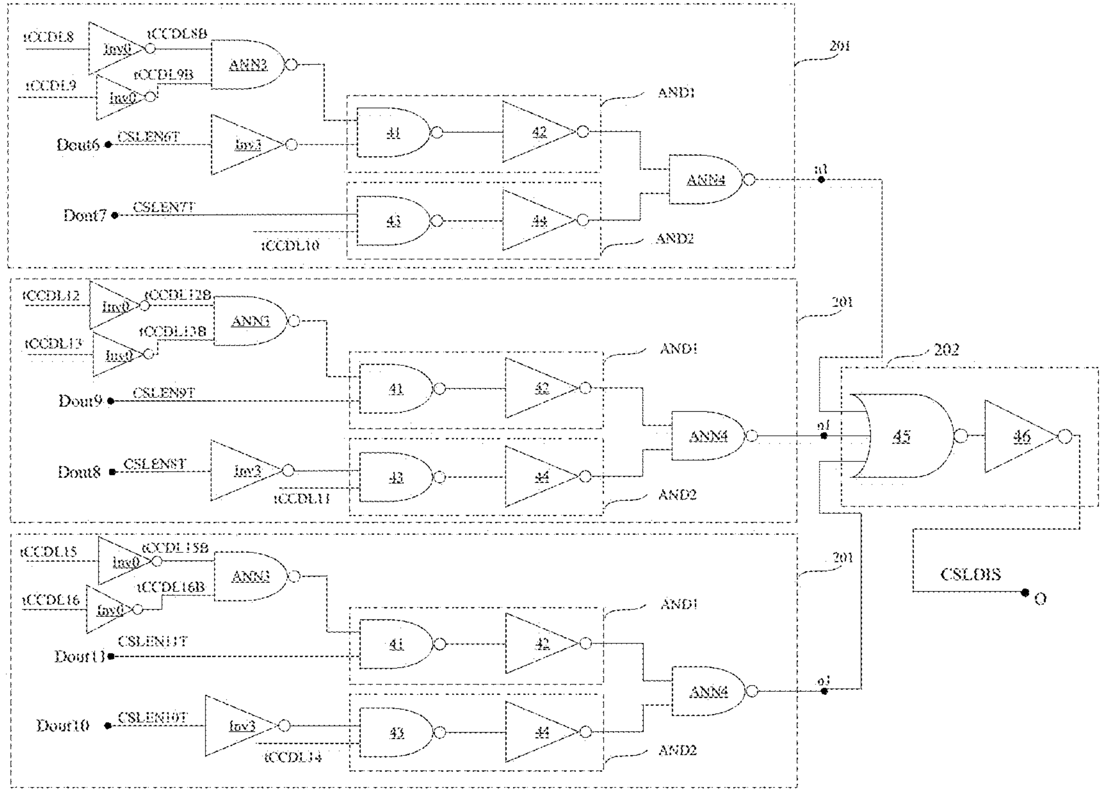
FIG. 20 is a schematic diagram of a circuit structure of a gating circuit according to an embodiment of the present disclosure.

FIG. 20 is a schematic diagram of a circuit structure of a gating circuit according to an embodiment of the present disclosure.

Referring to FIG. 20, the gating circuit 21 includes three gating units 201.

It should be noted that FIG. 20 is merely a specific implementation for implementing a gating circuit having a delay range of 6T to 11T relative to the column selection start signal CSLEN0T. A specific circuit structure of the gating circuit is not limited in this embodiment of the present disclosure, and another specific circuit structure that can have a delay of 6T to 11T relative to the column selection start signal CSLEN0T may alternatively serve as the gating circuit. In addition, a specific circuit structure of a corresponding gating circuit may change with the delay range.

Delay signals received by a gating unit 201 are CSLEN6T and CSLEN7T, the inverted signals of the two control codes received by the third NAND gate ANN3 are respectively denoted as tCCDL8B and tCCDL9B, and the control code received by the second AND gate AND2 is denoted as tCCDL10. tCCDL8B and tCCDL8 are taken as examples. tCCDL8B corresponds to an inverted signal of the control code tCCDL8. If one of the control code and the corresponding inverted signal is 0, the other is 1. To avoid repetition, for tCCDL9B, tCCDL12B, tCCDL13B, tCCDL15B, and tCCDL16B, reference may be made to the descriptions of tCCDL_8B, and details are not described again later.

As can be learned from the foregoing analysis, the output node Dout6 receiving CSLEN6T is connected to the first AND gate AND1 through the third inverter Inv3, and the output node Dout7 receiving CSLEN7T is directly connected to the second AND gate AND2.

Delay signals received by another gating unit 201 are CSLEN8T and CSLEN9T, the inverted signals of the two control codes received by the third NAND gate ANN3 are respectively denoted as tCCDL12B and tCCDL13B, and the control code received by the second AND gate AND2 is denoted as tCCDL11.

As can be learned from the foregoing analysis, the output node Dout8 receiving CSLEN8T is connected to the second AND gate AND2 through the third inverter Inv3, and the output node Dout9 receiving CSLEN9T is directly connected to the first AND gate AND1.

Delay signals received by still another gating unit 201 are CSLEN10T and CSLEN11T, the inverted signals of the two control codes received by the third NAND gate ANN3 are denoted as tCCDL15B and tCCDL16B, and the control code received by the second AND gate AND2 is denoted as tCCDL14.

As can be learned from the foregoing analysis, the output node Dout10 receiving CSLEN10T is connected to the second AND gate AND2 through the third inverter Inv3, and the output node Dout11 receiving CSLEN11T is directly connected to the first AND gate AND1.

Referring to FIG. 20, several column selection end signals CSLDIS shown in Table 2 may be generated by the delay control circuit 101, and t1 is the first delay amount.

TABLE 2

| Sequence number | CSLDIS | t1 | Control code with a value 1 | Control code with a value 0 |
|---|---|---|---|---|
| 1 | CSLEN6T | 6T | One of tCCDL8 and tCCDL9 | tCCDL10, tCCDL11, tCCDL12, tCCDL13, tCCDL15, tCCDL16, tCCDL14, and the other one of tCCDL8 and tCCDL9 |
| 2 | CSLEN7T | 7T | tCCDL10 | tCCDL11, tCCDL14, tCCDL8, tCCDL9, tCCDL15, tCCDL16, tCCDL12, and tCCDL13 |
| 3 | CSLEN8T | 8T | tCCDL11 | tCCDL10, tCCDL14, tCCDL8, tCCDL9, tCCDL12, tCCDL13, tCCDL15, and tCCDL16 |
| 4 | CSLEN9T | 9T | One of tCCDL12 and tCCDL13 | tCCDL10, the other one of tCCDL12 and tCCDL13, tCCDL11, tCCDL14, tCCDL8, tCCDL9, tCCDL15, and tCCDL16 |
| 5 | CSLEN10T | 10T | tCCDL14 | tCCDL11, tCCDL10, tCCDL15, tCCDL16, tCCDL12, tCCDL13, tCCDL8, and tCCDL9 |
| 6 | CSLEN11T | 11T | One of tCCDL15 and tCCDL16 | The other one of tCCDL15 and tCCDL16, tCCDL14, tCCDL11, tCCDL10, tCCDL12, tCCDL13, tCCDL8, and tCCDL9 |

It is easy to find that Table 2 corresponds to Table 1. For example, when CSLDIS is CSLEN6T, in other words, the multiple of the first delay amount t1 relative to tCK is 6, as shown in Table 1 and Table 2, tCCDL8 is 1 or tCCDL9 is 1. tCCDL8 is set to 1 when the multiple of the first delay time tCCD_L relative to tCK/the quantity of clock cycles is 8, and tCCDL9 is set to 1 when the multiple of the first delay time tCCD_L relative to tCK/the quantity of clock cycles is 9. The multiple of the first delay amount t1 relative to tCK is 7 when CSLDIS is CSLEN7T. As shown in Table 1 and Table 2, tCCDL10 is 1.

Figure 21:
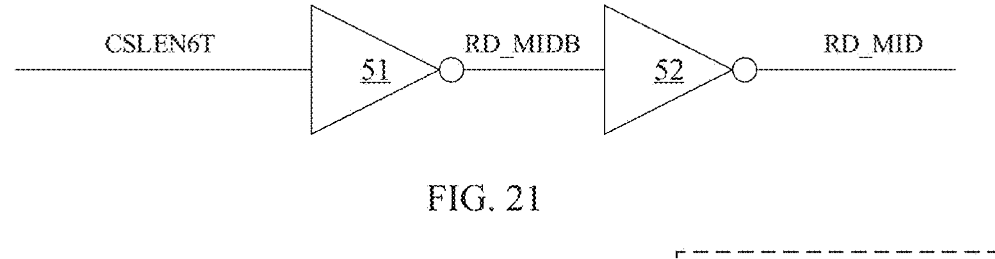
FIG. 21 is a schematic structural diagram of a delay control circuit according to an embodiment of the present disclosure.

FIG. 21 is a schematic structural diagram of a delay control circuit according to an embodiment of the present disclosure. Referring to FIG. 21, the delay control circuit may further include a third sub-inverter 51 and a fourth sub-inverter 52. An input terminal of the third sub-inverter 51 is connected to an output node, an output terminal thereof is connected to an input terminal of the fourth sub-inverter 52, and the trigger signal RD_MID is output by an output terminal of the fourth sub-inverter 52.

In FIG. 21, for example, a delay signal received by the third sub-inverter 51 is CSLEN6T. Correspondingly, a delay amount of the trigger signal RD_MID relative to the column selection start signal CSLEN0T is 6T.

In some other examples, the delay signal received by the third sub-inverter 51 may alternatively be any one of CSLEN1T, CSLEN2T, CSLEN3T, . . . , and CSLEN11T, provided that the third delay amount and the first delay amount meet the foregoing limitation.

In addition, the trigger signal RD_MID may alternatively be generated with a trigger circuit, and the trigger circuit may be a gating circuit of a structure similar to the structures shown in FIG. 14 to FIG. 20. A delay signal output by one of the multiple output nodes of the delay circuit 11 is selected by the trigger circuit as the trigger signal RD_MID based on a trigger delay selection signal.

In some examples, the trigger delay selection signal may be the same as the delay selection signal, provided that the generated trigger signal RD_MID meets the foregoing limitation between the third delay amount t3 and the first delay amount t1.

It may be understood that a circuit structure of the delay control circuit is not specifically limited in this embodiment of the present disclosure, and any delay control circuit that can select one of multiple delay signals as the column selection end signal can be applied to this embodiment of the present disclosure.

Correspondingly, the embodiments of the present disclosure further provide a memory device, which may include the column control circuit provided in the foregoing embodiments. The following describes the memory device provided in the embodiments of the present disclosure. It should be noted that the content in the foregoing embodiments is also applicable to embodiments of the memory device.

Figure 22:
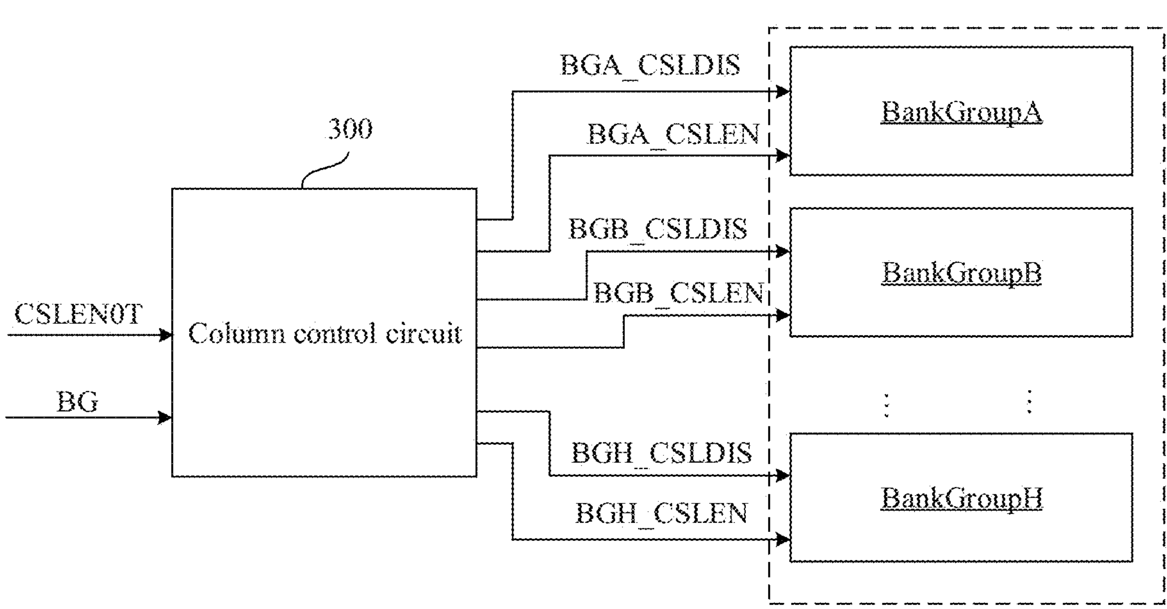
FIG. 22 is a schematic structural diagram of a memory device according to an embodiment of the present disclosure.
Figure 23:
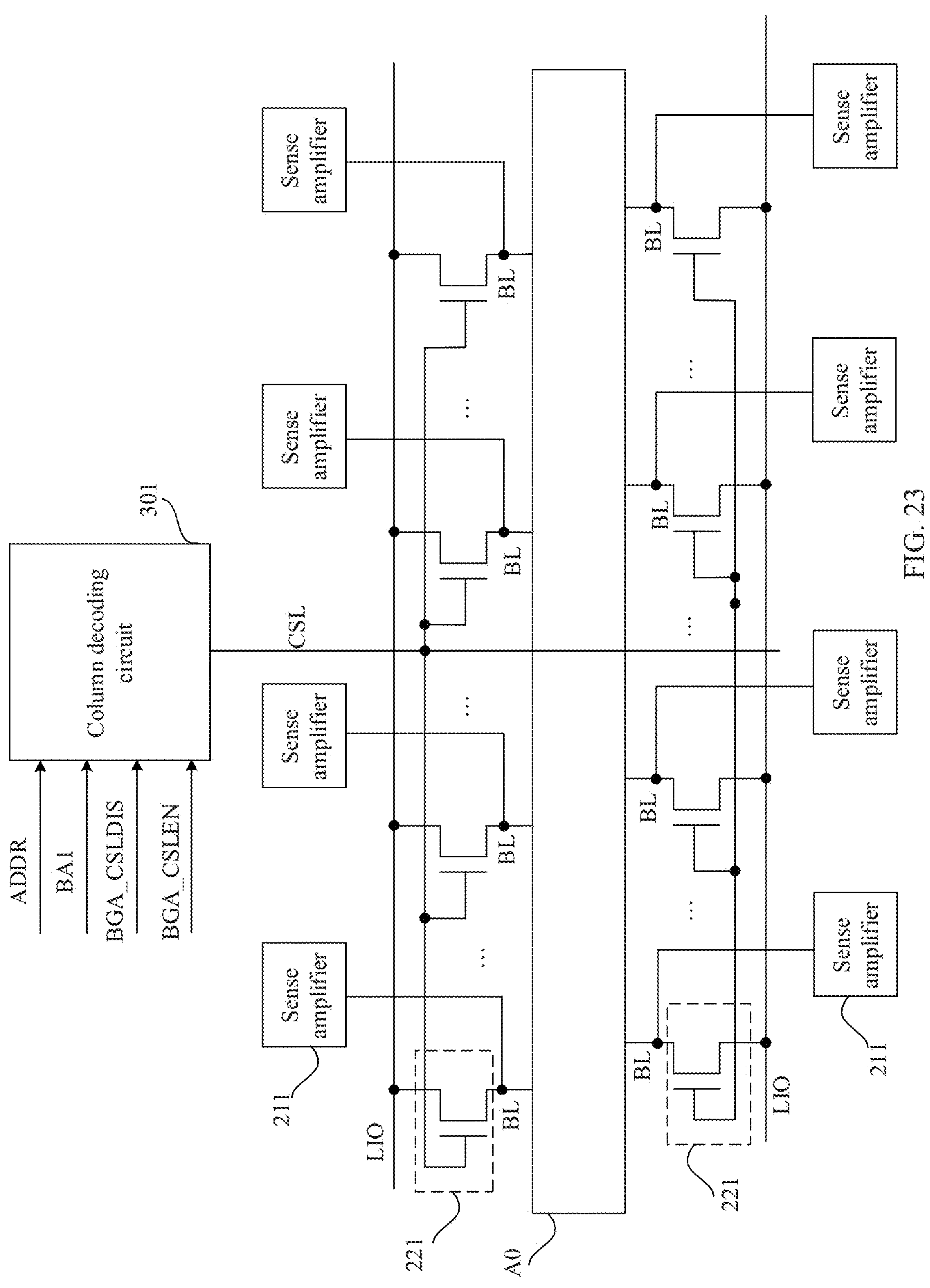
FIG. 23 is a schematic structural diagram of a memory cell array in a bank group BankGroupA.

FIG. 22 is a schematic structural diagram of a memory device according to an embodiment of the present disclosure. FIG. 23 is a schematic structural diagram of a memory cell array in a bank group BankGroupA.

Referring to FIG. 22 and FIG. 23, the memory device includes a column control circuit 300 and multiple bank groups, each of the bank groups includes multiple memory cell arrays, each of the memory cell arrays includes multiple memory cells, and each of the memory cell arrays is connected to multiple column selection switching transistors 221.

The memory device may be a random access memory (RAM), a read-only memory (ROM), a static random access memory (SRAM), a dynamic random access memory (DRAM), a synchronous dynamic random access memory (SDRAM), a resistive random access memory (RRAM), a double data rate (DDR) memory, a low power double data rate (LPDDR) memory, a phase change memory (PCM), or a flash memory.

Different bank groups are respectively denoted as BankGroupA, BankGroupB, . . . , and BankGroupH. The column control circuit 300 receives a column selection start signal CSLEN0T and a target bank group selection signal BG, generates a target column selection start signal BG_CSLEN and a target column selection end signal BG_CSLDIS, and further generates a target column selection window signal CSLSLV.

In FIG. 22, for the bank group BankGroupA, a target column selection start signal and a target column selection end signal are respectively BGA_CSLEN and BGA_CSLDIS. For the bank group BankGroupB, a target column selection start signal and a target column selection end signal are respectively BGB_CSLEN and BGB_CSLDIS. For the bank group BankGroupH, a target column selection start signal and a target column selection end signal are respectively BGH_CSLEN and BGH_CSLDIS.

It should be noted that although target column selection start signals and target column selection end signals corresponding to different bank groups are marked in FIG. 22, actually, at the same moment, only one bank group may be selected as the target bank group, to be specific, a target column selection start signal and a target column selection end signal for only one bank group may be generated, and none of target column selection start signals and target column selection end signals corresponding to bank groups other than the target bank group are generated, in other words, all of the target column selection start signals and the target column selection end signals corresponding to the bank groups other than the target bank group are inactive.

Each bank group may include multiple banks (BANK), and each bank includes at least one memory cell array.

Referring to FIG. 23, a memory cell array in a bank of the bank group BankGroupA is denoted as A0. Some column selection switching transistors 221 are controlled by the same column selection signal, to be specific, gates of the some column selection switching transistors 221 are connected to the same column selection line CSL, and the column selection line CSL is configured to transmit a column selection signal to the some column selection switching transistors 221. In other words, the same column selection signal is received by multiple column selection switching transistors 221 through the same column selection line CSL. When a column selection signal is active, a column selection line CSL receiving the column selection signal is selected, so that column selection switching transistors 221 connected to the column selection line CSL are turned on.

A memory cell array A0 has multiple bit lines BL, each bit line BL is connected to a sense amplifier 211, each bit line BL is further connected to a local data line LIO through the column selection switching transistor 221, and the column selection line CSL is connected to a gate of each column selection switching transistor 221. If the column selection switching transistor 221 is turned on, a transmission path between the bit line BL and the local data line LIO is conducted, to implement data transmission between the bit line BL and the local data line LIO, and the local data line LIO is connected to a read/write circuit, to implement data transmission between the local data line LIO and a global data line through the read/write circuit.

In some examples, based on arrangement locations of all bit lines BL of the memory cell array A0, a bit line BL at an odd-numbered location may be connected to a local data line LIO through a column selection switching transistor 221, and a bit line at an even-numbered location may be connected to another local data line LIO through a column selection switching transistor 221. Each sense amplifier array includes multiple sense amplifiers 211. In this way, when a column selection line CSL is selected, in other words, a column selection signal received by the column selection line CSL is active, all column selection switching transistors 221 connected to the two local data lines LIO are turned on, so that a transmission path between a bit line BL of the memory cell array A0 and a corresponding local data line LIO is conducted.

In an example, the column selection switching transistor 221 may be an NMOS transistor, and if a column selection signal transmitted by a column selection line CSL is active, in other words, is 1, column selection switching transistors 221 in a corresponding column are turned on.

For example, an operation performed on the bank group is a read operation. A read command includes a bank group selection signal (also referred to as a BG address), a bank selection signal (also referred to as a BA address), and a column address signal. The column address signal is sent to each bank, and the bank selection signal is configured to define a location of a target bank. For example, the target bank group is BankGroupA, and the target bank is BANK1. The column control circuit 300 generates a target column selection start signal BGA_CLSEN and a target column selection end signal BGA_CSLDIS corresponding to the target bank group selection signal BG_A, and target column selection start signals and all target column selection end signals corresponding to remaining bank groups are inactive.

The memory device may further include a column decoding circuit 301. An internal target column selection start signal and an internal target column selection end signal are generated by the column decoding circuit 301 based on the target column selection start signal BGA_CLSEN, the target column selection end signal BGA_CSLDIS, and the bank selection signal BAL. The bank selection signal BA1 indicates that BANK1 is the target bank.

A column selection signal is further generated and output by the column decoding circuit 301 based on the received column address signal ADDR, the internal target column selection start signal, and the internal target column selection end signal. The column selection signal is provided by the column decoding circuit 301 to the column selection line CSL.

The column selection switching transistor 221 is turned on in response to a corresponding internal target column selection start signal, and is turned off in response to a corresponding internal target column selection end signal. Specifically, when the internal target column selection start signal is active, the column selection signal starts to be active, and the column selection switching transistor 221 is turned on. When the internal target column selection end signal is active, the column selection signal changes from active to inactive, and the column selection switching transistor 221 is turned off.

A person of ordinary skill in the art may understand that the foregoing implementations are specific embodiments for implementing the present disclosure. In an actual application, various modifications may be made to the forms and details of the implementations without departing from the scope of the embodiments of the present disclosure. Any person skilled in the art may make changes and modifications without departing from the scope of the embodiments of the present disclosure. Therefore, the protection scope of the embodiments of the present disclosure shall be subject to the scope defined by the claims.

INDUSTRIAL APPLICABILITY

In the technical solutions of the column control circuit provided in the embodiments of the present disclosure, the target column selection window signal has the second delay amount relative to the column selection start signal, the column selection end signal has the first delay amount relative to the column selection start signal, and the second delay amount is less than or equal to the first delay amount, in other words, the active start moment of the target column selection window signal is earlier than the active start moment of the column selection end signal, or the active start moment of the target column selection window signal is aligned with the active start moment of the column selection end signal, so that the active start moment of the column selection end signal can be sampled by the target column selection window signal. In addition, the active duration of the target column selection window signal is greater than or equal to the active duration of the target bank group selection signal, so that the active end moment of the column selection end signal with a larger delay amount can still be earlier than an active end moment of the target column selection window signal, and therefore, the active end moment of the column selection end signal can also be sampled by the target column selection window signal.

For example, even if the operating frequency of the memory device changes, the column selection end signal can always be sampled by the target column selection window signal. Alternatively, the first delay amount or the second delay amount changes, so that a time interval between the target column selection end signal and the target column selection start signal changes. In the technical solutions provided in the embodiments of the present disclosure, the column selection end signal can always be sampled by the target column selection window signal.

What is claimed is:

1. A column control circuit, comprising:

a delay control circuit, configured to receive a column selection start signal and perform delay processing on the column selection start signal to generate and output a column selection end signal, the column selection end signal having a first delay amount relative to the column selection start signal; and a control signal generation circuit, connected to the delay control circuit and configured to: receive the column selection start signal, the column selection end signal, and a target bank group selection signal, and perform a first logical operation on the column selection start signal and the target bank group selection signal to generate and output a target column selection start signal; and generate and output a target column selection window signal based on the column selection start signal and the target bank group selection signal, and perform a second logical operation on the target column selection window signal and the column selection end signal to generate and output a target column selection end signal, the target column selection window signal having a second delay amount relative to the column selection start signal, the second delay amount being less than or equal to the first delay amount, and active duration of the target column selection window signal being greater than or equal to active duration of the target bank group selection signal.

2. The column control circuit according to claim 1, wherein the control signal generation circuit comprises:

a plurality of target signal generation circuits, each of the target signal generation circuits corresponding to one bank group, each bank group corresponding to one target bank group selection signal, and each target signal generation circuit corresponding to each bank group being configured to:

receive the column selection start signal, the column selection end signal, and the target bank group selection signal corresponding to the bank group, and output a target column selection start signal, a target column selection window signal, and a target column selection end signal corresponding to the bank group.

3. The column control circuit according to claim 2, wherein each target signal generation circuit comprises:

a synchronization circuit, configured to: receive the target bank group selection signal and the column selection start signal, and sample the target bank group selection signal in response to the column selection start signal, to generate and output a target bank group synchronization signal, a target bank group synchronization signal in an active state being output when the target bank group selection signal is in an active state and the column selection start signal changes from inactive to active, and a target bank group synchronization signal in an inactive state being output when the target bank group selection signal is in an inactive state and the column selection start signal changes from inactive to active;

a start signal generation circuit, configured to: receive the target bank group selection signal and the column selection start signal, and perform an AND operation to generate and output the target column selection start signal;

a window signal generation circuit, configured to: receive the target bank group synchronization signal and a trigger signal, and perform delay processing on the target bank group synchronization signal based on the trigger signal, to generate and output the target column selection window signal, the trigger signal having a third delay amount relative to the column selection start signal, the third delay amount being equal to the second delay amount, and the target column selection window signal being active from a moment at which the trigger signal starts to be in an active state to a moment at which an active state of a next trigger signal arrives; and an end signal generation circuit, configured to: receive the target column selection window signal and the column selection end signal, and perform an AND logical operation to generate and output the target column selection end signal.

4. The column control circuit according to claim 3, wherein the synchronization circuit comprises:

a first D flip-flop, a data input terminal of the first D flip-flop receiving the target bank group selection signal, a clock terminal thereof receiving the column selection start signal, and a non-inverting output terminal thereof outputting the target bank group synchronization signal.

5. The column control circuit according to claim 3, wherein the start signal generation circuit comprises:

a first NAND gate, two input terminals thereof respectively receiving the target bank group synchronization signal and the column selection start signal; and a first inverter, an input terminal thereof being connected to an output terminal of the first NAND gate, and an output terminal thereof outputting the target column selection start signal.

6. The column control circuit according to claim 3, wherein the window signal generation circuit comprises:

a second D flip-flop, a data input terminal of the second D flip-flop receiving the target bank group synchronization signal, a clock terminal of the second D flip-flop receiving the trigger signal, and a non-inverting output terminal of the second D flip-flop outputting the target column selection window signal.

7. The column control circuit according to claim 3, wherein the end signal generation circuit comprises:

a second NAND gate, one input terminal thereof receiving the target column selection window signal, and the other input terminal thereof receiving the column selection end signal; and a second inverter, an input terminal thereof being connected to an output terminal of the second NAND gate, and an output terminal thereof outputting the target column selection end signal.

8. The column control circuit according to claim 3, wherein the trigger signal is a delay signal of the column selection start signal; and the first delay amount and the third delay amount are adjustable, and the third delay amount is less than or equal to a minimum value of the first delay amount.

9. The column control circuit according to claim 8, wherein the delay control circuit is further configured to perform delay processing on the column selection start signal to generate and output the trigger signal.

10. The column control circuit according to claim 1, wherein the first delay amount and the second delay amount meet: t2≤tCCD_S-2T and t2≤t1≤t2+tCCD_S-2T, t1 being the first delay amount, t2 being the second delay amount, 2T being active duration of the column selection start signal, T being one clock cycle, and tCCD_S being the active duration of the target bank group selection signal.

11. The column control circuit according to claim 1, wherein the delay control circuit is further configured to: receive a delay selection signal, and adjust the first delay amount based on the delay selection signal.

12. The column control circuit according to claim 11, wherein the delay control circuit comprises:

a delay circuit having an input node and N output nodes and being configured to: receive the column selection start signal through the input node, and output N delay signals through the N output nodes, the N output nodes comprising a first output node to an $N^{th}$ output node arranged in ascending order of natural numbers, delay amounts of the N delay signals respectively output by the first output node to the $N^{th}$ output node relative to the column selection start signal successively increment, and N being a natural number greater than or equal to 2; and a gating circuit, being connected to m output nodes, having a gating output terminal, and being configured to gate a transmission path between one of the m output nodes and the gating output terminal in response to the delay selection signal, to output the column selection end signal through the gating output terminal, m being a natural number less than or equal to N.

13. The column control circuit according to claim 12, wherein the delay circuit comprises:

N cascaded first D latches, a data input terminal of a first-stage first D latch serving as the input node, and an inverting output terminal of a current-stage first D latch being connected to a data input terminal of a next-stage first D latch, a clock terminal of each first D latch at an odd-numbered location receiving a clock signal, a clock terminal of each first D latch at an even-numbered location receiving an inverted clock signal, the inverted clock signal and the clock signal being inverted signals of each other, and inverting output terminals of the N first D latches serving as the N output nodes.

14. The column control circuit according to claim 12, wherein the delay circuit is further configured to: in response to a read operation command, generate the column selection start signal, and provide the column selection start signal for the input node.

15. The column control circuit according to claim 14, wherein the delay circuit comprises:

an even number of cascaded second D latches, a data input terminal of a first-stage second D latch receiving the read operation command, and an inverting output terminal of a current-stage second D latch being connected to a data input terminal of a next-stage second D latch, a clock terminal of each second D latch at an odd-numbered location receiving the clock signal, a clock terminal of each second D latch at an even-numbered location receiving an inverted clock signal, an inverted clock signal and the clock signal being inverted signals of each other, and an inverting output terminal of a last-stage second D latch being connected to the input node and outputting the column selection start signal.

16. The column control circuit according to claim 12, wherein the gating circuit comprises:

at least one gating unit, each of the at least one gating unit being connected to two corresponding and adjacent output nodes in the m output nodes, and each gating unit being configured to:

gate a transmission path between one of the two output nodes and an output terminal of the gating unit in response to the delay selection signal.

17. The column control circuit according to claim 16, wherein the delay selection signal comprises p bits of control codes, each gating unit receives three corresponding and adjacent control codes, p is a natural number greater than or equal to 3, and active levels of delay signals output by two adjacent output nodes are opposite to each other; and each gating unit comprises:

a third NAND gate, each of two input terminals of the third NAND gate receiving an inverted signal of one of the three control codes;

a third inverter, an input terminal of the third inverter being connected to an output node;

a first AND gate, two input terminals of the first AND gate being respectively connected to an output terminal of the third NAND gate and an output terminal of the third inverter;

a second AND gate, one input terminal of the second AND gate receiving the remaining one of the three control codes, and the other input terminal thereof being connected to another output node; and a fourth NAND gate, an input terminal of the fourth NAND gate being connected to an output terminal of the first AND gate and an output terminal of the second AND gate, and an output terminal of the fourth NAND gate serving as an output terminal of the gating unit.

18. The column control circuit according to claim 16, wherein the gating circuit comprises at least two gating units, and output nodes connected to different gating units are different; and the gating circuit further comprises:

an OR gate, an input terminal of the OR gate being connected to an output terminal of each gating unit, and an output terminal of the OR gate serving as the gating output terminal.

19. A memory device, comprising:

a plurality of bank groups, each of the bank groups comprising a plurality of memory cell arrays, each of the memory cell arrays comprising a plurality of memory cells, and each of the memory cell arrays being connected to a plurality of column selection switching transistors; and the column control circuit according to claim 1, the column selection switching transistor being turned on in response to a corresponding target column selection start signal, and being turned off in response to the target column selection end signal.

* * * * *